US009717170B2

(12) United States Patent
Sarto et al.

(10) Patent No.: US 9,717,170 B2
(45) Date of Patent: Jul. 25, 2017

(54) GRAPHENE NANOPLATELETS- OR GRAPHITE NANOPLATELETS-BASED NANOCOMPOSITES FOR REDUCING ELECTROMAGNETIC INTERFERENCES

(71) Applicant: UNIVERSITÀ DEGLI STUDI DI ROMA "LA SAPIENZA", Rome (IT)

(72) Inventors: Maria Sabrina Sarto, Rome (IT); Giovanni De Bellis, Rome (IT); Alessio Tamburrano, Rome (IT); Alessandro Giuseppe D'Aloia, Rome (IT)

(73) Assignee: UNIVERSITA DEGLI STUDI DI ROMA "LA SAPIENZA", Rome (IT)

( * ) Notice: Subject to any disclaimer, the term of this patent is extended or adjusted under 35 U.S.C. 154(b) by 0 days.

(21) Appl. No.: 14/435,835

(22) PCT Filed: Oct. 16, 2013

(86) PCT No.: PCT/IT2013/000286
§ 371 (c)(1),
(2) Date: Apr. 15, 2015

(87) PCT Pub. No.: WO2014/061048
PCT Pub. Date: Apr. 24, 2014

(65) Prior Publication Data
US 2015/0305212 A1    Oct. 22, 2015

(30) Foreign Application Priority Data

Oct. 16, 2012    (IT) .............................. RM2012A0495

(51) Int. Cl.
C01B 31/04    (2006.01)
H01B 1/24    (2006.01)
(Continued)

(52) U.S. Cl.
CPC ............ *H05K 9/0083* (2013.01); *B82Y 30/00* (2013.01); *B82Y 40/00* (2013.01); *C01B 31/04* (2013.01);
(Continued)

(58) Field of Classification Search
CPC ............... H01B 1/02–1/04; H01B 1/24; C01B 31/02–31/04; C01B 31/0423; C01B 31/0476; C01B 31/0415
(Continued)

(56) References Cited

U.S. PATENT DOCUMENTS 5,094,907 A   3/1992 Yamamura et al.
5,554,678 A   9/1996 Katsumata et al.
(Continued)

OTHER PUBLICATIONS

Singh ("Microwave absorbing properties of a thermally reduced graphene oxide/nitrile butadiene rubber composite." Carbon, 50, pp. 2202-2208, online Jan. 18, 2012).*

(Continued)

*Primary Examiner* — Tri V Nguyen
(74) *Attorney, Agent, or Firm* — Young & Thompson

(57) ABSTRACT

A process for producing GNP-based polymeric nanocomposites for electromagnetic applications such as shielding and/or absorption of the energy associated to electromagnetic fields envisages a plurality of steps that include: controlled synthesis, for optimizing the morphological and electrical properties thereof, of graphene nanoplatelets (GNPs) to be used as nanofillers in a polymeric matrix; selection of the polymeric matrix so as to optimize its chemical compatibility with the type of GNPs thus obtained; production via the solution-processing technique of GNP-based polymeric nanocomposites with dielectric permittivity and electric conductivity controlled and predictable via the equivalent-effective-medium model by calibrating the
(Continued)

parameters of the model for the specific type of polymeric matrix and GNPs used.

4 Claims, 10 Drawing Sheets

(51) Int. Cl.
| | |
|---|---|
| *H05K 9/00* | (2006.01) |
| *H01Q 17/00* | (2006.01) |
| *B82Y 30/00* | (2011.01) |
| *B82Y 40/00* | (2011.01) |
| *B82Y 99/00* | (2011.01) |

(52) U.S. Cl.
CPC .......... *C01B 31/0438* (2013.01); *H01B 1/24* (2013.01); *H01Q 17/00* (2013.01); *B82Y 99/00* (2013.01); *Y10S 977/734* (2013.01)

(58) Field of Classification Search
USPC ...................... 252/500–511; 423/445 R–448
See application file for complete search history.

(56) References Cited

U.S. PATENT DOCUMENTS

| | | | |
|---|---|---|---|
| 5,952,953 | A | 9/1999 | Nikawa et al. |
| 6,043,769 | A | 3/2000 | Rowe et al. |
| 6,762,237 | B2 | 7/2004 | Glatkowski et al. |
| 6,818,821 | B2 | 11/2004 | Fujieda et al. |
| 6,936,653 | B2 | 8/2005 | McElrath et al. |
| 7,239,261 | B2 | 7/2007 | Fujieda et al. |
| 7,411,019 | B1 | 8/2008 | Bley |
| 7,658,901 | B2 | 2/2010 | Prud'Homme et al. |
| 8,114,373 | B2 | 2/2012 | Jang et al. |
| 2002/0035170 | A1 | 3/2002 | Glatkowski et al. |
| 2004/0023957 | A1 | 2/2004 | Wang et al. |
| 2004/0127621 | A1 | 7/2004 | Drzal et al. |
| 2006/0058187 | A1 | 3/2006 | Lucas |
| 2007/0092432 | A1* | 4/2007 | Prud'Homme ....... C01B 31/043 423/448 |
| 2007/0120100 | A1 | 5/2007 | Glatkowski et al. |
| 2007/0131915 | A1* | 6/2007 | Stankovich ......... C01B 31/0423 252/511 |
| 2007/0228317 | A1 | 10/2007 | Barrera et al. |
| 2008/0057265 | A1 | 3/2008 | Liang et al. |
| 2008/0306225 | A1 | 12/2008 | Prud'Homme et al. |
| 2010/0000441 | A1* | 1/2010 | Jang ..................... C09D 11/037 106/31.13 |
| 2010/0140792 | A1 | 6/2010 | Haddon et al. |
| 2012/0164433 | A1 | 6/2012 | Advincula |

OTHER PUBLICATIONS

Faez et al., "Microwave properties of EPDM/PAni-DBSA blends," Synthetic Metals 119 (2001), pp. 435-436.

Fan et al., "Electromagnetic and microwave absorbing properties of multi-walled carbon nanotubes/polymer composites," Materials Science and Engineering B 132 (2006), pp. 85-89.

Lagarkov et al., "Dielectric properties of fiber-filled composited," Journal of Applied Physics, vol. 84, No. 7, Oct. 1, 1998, pp. 3806-3814.

Lee et al., "Fabrication and design of multi-layered radar absorbing structures of MWNT-filled glass/epoxy plain-weave composited," Composite Structures 76 (2006), pp. 397-405.

Marchant et al., "Free-space microwave characteristics of polypyrrole coated glass fibre," Synthetic Metals 96 (1998), pp. 35-41.

Matitsine et al., "Shift of resonance frequency of long conducting fibers embedded in a composite," Journal of Applied Physics, vol. 94, No. 2, Jul. 15, 2003, pp. 1146-1154.

Neo et al., "Optimization of Carbon Fiber Composite for Microwave Absorber," IEEE Transactions on Electromagnetic Compatibility, vol. 46, No. 1, Feb. 2004, pp. 102-106.

Oh et al., "Design of radar absorbing structures using glass/epoxy composite containing carbon black in X-band frequency ranges," Composites: Part B 35 (2004), pp. 49-56.

Pike et al., "Percolation and conductivity: a computer study. I" Physical Review B, vol. 10, No. 4, Aug. 15, 1974, pp. 1421-1434.

Pinho et al., "Performance of radar absorbing materials by waveguide measurements for X- and Ku-band frequencies," European Polymer Journal 28 (2002), pp. 2321-2327.

Song et al., "Influence of dispersion states of carbon nanotubes on physical properties of epoxy nanocomposites," Carbon 43 (2005), pp. 1378-1385.

Tellakula et al., "Carbon fiber and nanotube based composited with polypyrrole fabric as electromagnetic absorbers," Smart Mater. Struct 13 (2004), pp. 1040-1044.

Toker et al., "Tunneling and percolation in metal-insulator composited materials," Physical Review B 69 (2003), pp. 041403-1 to 041403-4.

Wu et al., "Electromagnetic and microwave absorbing properties of iron fibre-epoxy resin composites," J. Phys. D.: Appl. Phys. 33 (2000), pp. 2398-2401.

Sarto M S et al.: "Synthesis, Modeling, and Experimental Characterization of Graphite Nanoplatelet-Based Composites for EMC Applications", IEEE Transactions on Electromagnetic Compatibility, IEEE Service Center, New York, NY, US, vol. 54, No. 1, Feb. 1, 2012 (Feb. 1, 2012), pp. 17-27, XP011433704, ISSN: 0018-9375, 001: 10.1109/TEMC.2011.2178853 the whole document.

Stankovich S et al.: "Graphene-based composite materials", Nature: International Weekly Journal of Science, Nature Publishing Group, United Kingdom, vol. 442. No. 7100, Jul. 20, 2006 (Jul. 20, 2006), pp. 282-286, XP002612450, ISSN: 0028-0836. DOI: 10.1038/NATURE04969 the whole document.

Giovanni De Bellis et al.: "Electromagnetic properties of composites containing graphite nanoplatelets at radio frequency", Carbon. Elsevier. Oxford. GB, vol. 49. No. 13.Jun. 2, 2011 (Jun. 2, 2011), pp. 4291-4300, XP028251375, ISSN: 0008-6223. DOI: 10.1016/J.CARBON2011.06.008 [retrieved on Jun. 12, 2011] the whole document.

International Search Report, dated Apr. 17, 2014, from corresponding PCT application.

* cited by examiner

GRAPHENE NANOPLATELETS- OR GRAPHITE NANOPLATELETS-BASED NANOCOMPOSITES FOR REDUCING ELECTROMAGNETIC INTERFERENCES

FIELD OF THE INVENTION

Background of the Invention

The present invention relates to the sector of nanotechnologies and more in particular to formulation and production of nanostructured materials with a base of graphite or graphene, in particular graphene nanoplatelets (GNPs) with controlled morphological and electrical properties, and use of said GNPs as fillers in variable concentrations for producing polymeric-matrix nanocomposites with controlled properties of complex dielectric permittivity at radiofrequency.

Description of the Related Art

The resulting material presents excellent mechanical and thermal characteristics and electrical and electromagnetic properties that can be defined (at the moment of formulation) in relation to the sphere of applicability. These multifunctional composites find application in electromagnetic shielding or as radar-absorbent materials (RAMS).

Conventional polymeric matrices, such as polystyrene, polypropylene, or epoxy resins, constitute a significant progress as compared to metals in terms of weight, resistance to corrosion, workability, versatility, and cost. These materials typically behave as electrical insulators, being transparent to radiofrequency electromagnetic waves, and hence cannot substitute metals in all applications where electrical conductivity and electromagnetic shielding are required.

Currently, in commercial applications, polymeric matrices surface-coated with metals are used. This type of treatment presents, however, many disadvantages and limitations, such as, for example, the risk of delamination and the impossibility of recycling the material. On the other hand, when insulating polymeric materials are mixed with sufficient amounts of conductive fillers, there is a drastic change in their properties of conductivity and electromagnetic shielding, linked to the type of filler, the degree of dispersion, and the concentration of the filler.

A particular application of conductive polymeric materials is in the field of radar-absorbent materials, which are able to shield and absorb the energy associated to the electromagnetic field, presenting a minimum reflection coefficient in well-defined frequency bands. The appropriate selection of the concentration and of the morphological and electrical properties of the filler can result in the control of the electromagnetic properties of the composite material.

One of the aspects still unsolved, which is tackled by the present invention, is represented by the possibility of controlling separately the real part and the imaginary part of the electrical permittivity of the composite, a capacity that is of strategic importance in the production of high-performance thin radar-absorbent coatings.

SUMMARY OF THE INVENTION

Consequently, the present invention regards the formulation and production of materials (specifically, graphite or graphene nanoplatelets—GNPs—and nanocomposites that contain them) with controlled electrical and electromagnetic properties to be used in applications of electromagnetic shielding or as radar-absorbent materials (RAMs). In addition to the aforesaid electromagnetic characteristics, these materials are light, easily workable, versatile, and suitable for low-cost mass production. Moreover, owing to the characteristics of electrical and thermal conductivity, they can be used in applications of thermal management as thermal-interface materials (TIMs), in integrated electronic circuits, or else in any other application that exploits their possibility of conducting electric current.

The versatility of these materials is linked to the possibility of obtaining them with any geometry and with desired electrical and electromagnetic properties. This result is achieved thanks to the formulation of polymeric-matrix composites with particles of nanometric dimensions (the GNPs) as fillers.

The production of composite materials suitable for applications of electromagnetic shielding or for suppression of electromagnetic interference (EMI) by absorption of electromagnetic energy requires in general use as fillers of conductive particles, typically having a spherical or pseudo-spherical shape, at high concentrations. In the case where the fillers have an ellipsoidal or cylindrical shape and/or are characterized by a high aspect ratio (namely, the ratio between the minimum dimension and the maximum dimension of the filler) it is possible to obtain composites for EMI applications even with filler concentrations of a few percentage points with respect to the weight of the matrix. However, the use of inclusions with a high aspect ratio, of macroscopic or micrometric dimensions, does not enable in general production of materials that, in addition to presenting the desired electrical or electromagnetic properties, are also homogeneous from the microscopic and isotropic standpoint, and present also good chemico-physical, structural, and mechanical properties.

A possible solution to this problem is afforded by the use of fillers of nanometric size at least in one dimension. There is thus obtained a polymeric-matrix composite with fillers constituted by particles of nanometric dimensions that goes by the name of "nanocomposite". In the case of nanocomposites, there presents in general the formation of new chemical bonds between the matrix and the filler, which may cause a substantial modification of the electrical and electromagnetic properties of the material, which is unforeseeable from application of the well-known rule of mixtures. The difficulty of dispersing the nanofillers homogeneously in the polymeric matrix entails, however, the formation of agglomerates of particles with a low aspect ratio that jeopardizes both the electromagnetic properties and the mechanical properties of the resulting composite. This mechanism is typical of nanocomposites with carbon nanotubes (CNTs) as fillers.

One of the limitations in the use of CNTs in nanocomposites consists in the impossibility of controlling separately the real part and the imaginary part of the effective permittivity of the material at radiofrequency. Separate control the of the real part and the imaginary part, which is of fundamental importance in the production of high-performance thin RAMs, can be instead achieved by combining the use of different types of fillers, characterized by dimensions defined on different dimensional scales (for example, CNTs combined with short carbon fibres, or CNTs combined with carbon black), as shown by the present applicants in Composites Science and Technology, Vol. 70, No. 1, 2010, pp. 102-109.

The present applicants have then proposed in IEEE Trans. on EMC, Vol. 54, No. 1, 2012, pp. 17-27, a new mathematical model for calculation of the dielectric permittivity of nanocomposites with a base of graphene nano-platelets (GNPs): Using this model it has been shown that from a theoretical standpoint it is possible to design nanocomposites with a desired real part and a desired imaginary part of the effective permittivity. GNPs are in fact nanostructures constituted by thin lamellae of graphene sheets set on top of one another (from a few units to some tens of units, with thicknesses comprised between 1 nm and 20 nm approximately), having lateral dimensions ranging from 0.5 µm to 25 µm, approximately. Consequently, if these nanostructures are dispersed in a polymeric matrix, they enable combination of the effect at a nanoscale linked to the high aspect ratio, which mainly determines the properties of electrical transport of the material and hence affects the value of the imaginary part of the effective dielectric permittivity, with the effect on a macroscale linked to the high surface extension, which mainly determines the properties of polarization of the material and hence affects the value of the real part of the effective dielectric permittivity.

In the same work, it is also shown, by means of numeric simulations, that it is possible to design panels made of GNP-based nanocomposite with radar-absorbent or shielding properties between 8 GHz and 18 GHz. However, the production of GNP-based nanocomposites, that present the electromagnetic properties and performance envisaged by the simulation models that have been developed, and of radar-absorbent or shielding panels obtained with said nanocomposites, requires the development of dedicated manufacturing processes, through which achievement of the desired properties is guaranteed by the specific sequence of the process steps and by the appropriate control of the physical parameters during the various steps.

It is consequently the task of the present invention to define a process for the production of radar-absorbent and/or shielding panels that is able to provide the desired electromagnetic performance and that comprises the steps described in what follows:

synthesis of graphene nanoplatelets (GNPs) with morphological and electrical properties controlled through the process parameters;

production of nanocomposite materials with GNP fillers having controlled electrical and electromagnetic properties, characterized by a high degree of lightness, easy workability, versatility, and low cost; and fabrication, by means of said nanocomposites, of thin panels or coatings with shielding and/or radar-absorbent properties at radiofrequency.

Control of the electrical and morphological properties of the GNPs and optimal selection of the polymeric matrix with reference to the desired electromagnetic performance on the basis of the compatibility with the nanofiller enable optimization of the electromagnetic properties of thin panels for applications of EMI reduction (shielding and/or radar-absorbance), guaranteeing homogeneity and isotropy of the material itself, easy workability, and scalability in an industrial process at contained costs.

Prior Art

The widespread automation of electrical and electronic apparatuses and systems and the continuous increase in the operating frequencies of electronic components and devices have led to an increasing interest in the development of multifunctional materials for electromagnetic shielding and suppression of electromagnetic interference.

In the last few years, the materials that are absorbent for electromagnetic radiation at radiofrequency (RF) have acquired a role of increasing importance in applications both of a civil nature and of a military nature for the purposes of control of the electromagnetic environment in complex systems and of reduction of electromagnetic interference. These materials are characterized by high shielding performance at RF but at the same time present a low reflection coefficient in a pre-set frequency range.

There consequently exists a considerable interest in the development of new technologies and new materials for producing new electromagnetic shields and absorbers at RF that are light and may also present multifunctionality properties.

A class of materials of considerable interest for applications in the aeronautic and naval sectors, for example, is represented by polymeric-matrix composite materials. For these applications, in fact, the compatibility of the technological processes for the production of shielding/absorbent materials with the technology of composite materials is a key aspect for the purpose of ensuring a direct and effective installation and use thereof.

Conductive polymers, such as for example polyanilines (PANI), polyacetylenes (PA), polypyrroles (PPy), etc., or non-conductive polymers, such as epoxy resins and polyesters, polychloroprenes (CR), ethylene-propylene-diene (EPDM), etc., are in general added with conductive fillers for providing radiofrequency-absorbent materials [1]-[8]. Some studies have highlighted that, among these materials, the composites reinforced with short carbon fibres or with fillers with a high aspect ratio are particularly suitable for producing composite materials with low values of the threshold of percolation at radiofrequency [9]-[10]. In the case of polymeric-matrix composites reinforced with short carbon fibres (for example, having a length in the region of some millimeters up to one centimeter for the range of application from 2 GHz to 18 GHz), the theoretical models suggest in fact that the choice of the length of the fibres enables very precise control of the electromagnetic properties of the resulting composite material, i.e., of the values of the effective relative dielectric permittivity and of the effective electrical conductivity [3], [4], [11].

One of the major limits in the use of short carbon fibres for producing materials with controlled electromagnetic properties lies, however, in the fact that, on account of the macroscopic dimensions of the inclusions, the resulting composite material presents in general as non-homogeneous on a microscale and macroscale, anisotropic, and consequently with mechanical properties of low interest.

The use of conductive fillers on a micrometric and submicrometric scale, such as for example carbon black or metal powders of a different type, is of low interest for applications in which materials with a high loss factor are to be produced. In general, in fact, this type of inclusions is characterized by values of the aspect ratio close to unity.

In order to overcome the limitations of traditional composites reinforced with short carbon fibres or with conductive powders, in the last decade there have been widely studied nanocomposites reinforced with nanoparticles with a high aspect ratio, such as for example carbon nanotubes [2], [12], [13], [14], [15]. The studies presented in the literature have shown that in theory a greater margin of control is possible over the electromagnetic, mechanical, and physicochemical properties of nanofiller-based composites. In fact, if the nanoparticles are dispersed appropriately in the polymeric matrix, they modify its properties of electronic transport. This does not occur in general with inclusions on a micrometric or macroscopic scale.

It is consequently evident that the capacity of modifying and controlling the properties of the nanocomposite depends not only upon control of the characteristics of the nanofillers (shape, size, type of material, concentration) but to a considerable extent also upon control of the chemical characteristics of the polymeric matrix and of the manufacturing process. One of the fundamental problems in the use of composites reinforced with nanoparticles lies, for example, in the effective capacity of dispersion of the nanoinclusions in a homogeneous way in the polymeric matrix, preventing formation of aggregates and/or agglomerates with a low aspect ratio that jeopardize considerably both the electromagnetic properties and the mechanical properties of the resulting composite. In fact, it has been shown, by means of numerical simulations, that, theoretically, on the hypothesis that the nanofillers are perfectly dispersed in the matrix without forming aggregates or clusters, it is possible to design high-performance radar-absorbent panels [16], [17]. However, manufacturing processes that guarantee synthesis of nanocomposites with these characteristics and that depend closely upon the type of matrix and nanofillers and upon the properties that are to be obtained, are not known in the prior art. In fact, the fabrication process of GNPs and of the nanocomposite filled with GNPs reported in [16] does not provide the necessary teachings and technical details, which are essential in order to produce nanocomposites with tailored electromagnetic properties, through the separate control of the imaginary part and of the real part of the effective permittivity. Such technical details includes: i) the specific combination of the parameter setting for the production of GNPs with controlled morphology and electrical conductivity; ii) the appropriate mixing technique that enables to overcome the main limitation of the state-of-art magnetic stirring, which consists is the single-mode rotation of a magnetic anchor and for this reason it does not prevent from agglomerate formation in the mixture.

The patent literature regarding composite materials for applications of electromagnetic shielding and for absorption of RF and microwave electromagnetic fields is very extensive ([15]-[23]). The majority of patents regards the production of conductive composites for producing radar-absorbent materials, based upon the use as fillers of carbon-based fibres ([15], [18], [20], [22]) of millimetric dimensions and a diameter in the region of some microns up to some ten microns. This is the case of composites that, from the microstructural standpoint, do not present characteristics of homogeneity and isotropy when they are used for producing shields of a thickness of less than one millimeter. The patent [19] regards the use of carbon black of a size ranging between approximately 10 nm up and 200 nm. These are inclusions with a practically unit aspect ratio, and consequently their use for applications of EMI reduction requires very high percentages of around some tens percentage points.

One of the first patents that mentions use of carbon nanotubes as nanofillers in polymeric matrices for producing materials designed to shield radiofrequency electromagnetic fields was published in 2002 ([21]). However, in this patent, the shielding capacity of the material is shown to depend upon the alignment of the nanotubes within the matrix and upon the elongation applied thereto. In the present invention, the nanofillers are understood as being randomly dispersed, without any preferential direction of alignment, precisely to guarantee isotropy of the properties of the material in all directions.

The patent [23] regards, instead, dispersion of carbon particles within foams for producing RF electromagnetic absorbers.

More recent patents ([24]-[31]) focus on composite materials with a base of carbon nanofibres and carbon nanotubes, whether coated or not by a thin metal film in order to improve their properties of electrical conductivity.

The U.S. Pat. No. 7,411,019 B1 [24] develops the chemistry necessary for incorporating carbon nanotubes, preferably single-walled CNTs, in polymeric matrices in such a way that the resulting composite will present some of the extraordinary mechanical properties of the nanotubes themselves. The patent hence does not focus on the aspects regarding the electromagnetic properties of the composite, nor does it discuss the problems of compatibility between the filler and matrix in order to optimize the electromagnetic properties of the composite.

The Patent No. US 2007/0120100 A1 [25] describes the use of composites containing carbon nanotubes for producing conformal coatings for protecting electrical and electronic components of devices from humidity, fungi, dust, abrasion, corrosion, and electromagnetic interference (EMI). The structure of the material may be layered. Electromagnetic shielding is guaranteed by a conductive layer obtained with nanometric inclusions of carbon nanotubes (SWCNTs, DWCNTs, MWCNTs). Declared shielding values range between 10 dB and 70 dB. The process is described, along with a wide range of examples. As regards EM performance only the values electromagnetic shielding effectiveness (SE) measured at some frequencies are given. The applications are limited to frequencies of up to 1 GHz.

The Patent No. US 2008/0057265 A1 [26] describes a method for producing a thin film of composite containing different types of nanofibres or nanotubes coated with metal layers (Cu, Ni) that are able to shield the electromagnetic field effectively. The film can be directly laid on the surface of the device to be protected or form part of a laminated composite. The patent does not develop the chemistry necessary to achieve optimal electromagnetic performance of the composite.

The U.S. Pat. No. 6,762,237 B2 [27] describes a dielectric nanocomposite obtained with a polymeric matrix with carbon-nanotube fillers with the purpose of increasing the effective relative permittivity of the material for use of the material as dielectric in high-capacitance capacitors. There is contemplated the possibility of providing multiphase composites with carbon nanotubes (preferably, oriented) and other dielectric and/or metallic inclusions. As inclusions there is suggested the use of powders of single-walled carbon nanotubes (SWCNTs) or mixed-walled carbon nanotubes (MWCNTs), that may even be metallized in order to improve the properties of conductivity. Two types of application are considered: dielectric materials for low frequency to be used in high-capacitance capacitors, and conductive materials for high frequency to be used as substrates of antennas. The patent does not develop the chemistry necessary to achieve optimal electromagnetic performance of the composite.

The U.S. Pat. No. 6,936,653 B2 [28] describes a composite constituted by a polar polymeric matrix with single-walled carbon nanotubes as fillers to obtain an increase of the d.c. electrical conductivity and effective thermal conductivity of the material. The invention focuses on very high concentrations in volumetric fraction of carbon nanotubes (between 10% and 50%) to achieve values of electrical conductivity of between 1 S/cm and 5 S/cm.

The U.S. Pat. No. 7,282,260 [29] describes an electrically conductive coating that is able to absorb electromagnetic fields. The invention develops a particular formulation of a polymeric ligand in water emulsion to be used as matrix for dispersion of the nanoparticles.

The U.S. Pat. No. 6,818,821 B2 [30] and U.S. Pat. No. 7,239,261 B2 [31] describe the production of radar-absorbent materials using composites prevalently filled with carbon shungite for the frequency band of up to some tens of gigahertz.

The following patents [32]-[37] regard development of nanostructures with a base of graphene, such as graphite nanoplatelets and graphene nanosheets, and production of polymeric nanocomposites that contain said nanostructures as fillers.

The patent Nos. U.S. Pat. No. 7,658,901 [32] "Thermally exfoliated graphite oxide" and 2008/0306225 A1 [33], filed on Dec. 11, 2008, "Polymerization method for formation of thermally exfoliated graphite oxide containing polymer" are very similar and mutually inclusive. These patents describe the method for the production of thermally exfoliated graphite oxide (TEGO) starting from the Staudenmaier method and expansions at temperatures of up to 3000° C. with a rate of up to and beyond 2000° C./min and for the production of the corresponding nanocomposites, which are on the other hand characterized in terms of d.c. and a.c. electrical conductivity.

Instead, in the present invention the starting material is a readily available low-cost material, such as, by way of non-limiting example, graphite intercalation compound (GIC) of a commercial type or else may be produced starting from natural graphite or kish; the expansion step is carried out in air and with a rate that is even much higher than 2000° C./min. For example, in the case of GICs expanded at 1250° C. for 5 s, the rate is as much as 15000° C./min. Moreover, the present invention defines the functional dependence between the properties of electrical conductivity of GNPs and the conditions of expansion. The process of sonication is based on the use of the ultrasound tip and is optimized, in relation to the type of solvent, in terms of duration and intensity of the pulses, whereas in the patents mentioned previously the sonication step is carried out for much longer times and in ultrasound bath. Moreover, in the present invention, also control of the temperature of the suspension during the sonication step is correlated to the achievement of pre-defined properties of d.c. electrical conductivity of the GNPs.

The technique of production described in the present invention is based upon vacuum-assisted magnetic stirring (but also applies to mechanical stirring), and not upon shear mixing. Moreover, the choice of the polymeric matrix is made on the basis of the check on compatibility with the type of GNPs to be used as fillers, obtained by FTIR spectroscopy.

Finally, the aforementioned patents do not discuss the electromagnetic performance of the nanocomposite, nor do they optimize the performance thereof for the purpose of applications to electromagnetic shielding or radar-absorbent materials at radiofrequency.

In the Patent No. US 2004/0127621 [34] the graphite nanoplatelets are obtained with a technique that is completely different from the one used in the present invention, i.e., by means of microwave or radiofrequency treatment. Moreover, the properties investigated are principally the mechanical properties and the properties of d.c. resistance.

In the Patent No. US 2010/0140792 [35], the GNPs are produced by means of thermal exfoliation of the GICs at temperatures lower than 1000° C. in inert atmosphere, whereas in the present invention there is envisaged the use of temperatures of up to 1500° C. and expansion is obtained in air. Moreover, the technique of production of the composites is different from the one developed in the present invention. The electromagnetic properties of the composite are not considered.

Amongst the most recent patents, we may mention US 2012/0164433 A1 [36] and U.S. Pat. No. 8,114,373 B2 [37].

However, the document [36] focuses principally on the properties at optical frequencies, whereas in the document [36] the procedure of synthesis of graphite nanoplatelets is markedly different from the one proposed in the present invention. In both cases, the electromagnetic properties of GNPs and of the corresponding nanocomposites are not considered.

In none of the patents mentioned above is there claimed the capacity of controlling the electromagnetic properties of the nanocomposite thanks to the dual interaction that the GNPs exert in regard to the polymeric matrix, i.e., at a nanoscale for control mainly of the imaginary part of the effective permittivity, and at a macro-scale for control mainly of the real part of the effective permittivity.

DETAILED DESCRIPTION OF THE INVENTION

The present invention regards graphite/graphene nanoplatelets (GNPs) and to GNP-based polymeric nanocomposites for electromagnetic applications, such as for example shielding and/or absorption of the energy associated to electromagnetic fields, or for stealth applications where the requirements of lightness and minimal thickness are stringent. Specifically, the invention develops the processes necessary for optimizing the morphological and electrical properties of GNPs and the electrical/electromagnetic properties of the GNP-based composite polymeric material in order to achieve the desired performance of attenuation of radiofrequency electromagnetic fields, with particular reference to the X and Ku bands.

The nanocomposites designed for the above purpose are constituted by a polymeric matrix in which GNPs are dispersed, appropriately processed in such a way as to optimize the electromagnetic properties of the composite.

The polymeric matrix is typically a thermosetting polymer, but may also be thermoplastic, and in any case is selected in such a way as to optimize the chemical compatibility with the type of GNPs having the desired electrical and morphological properties, to be used as nanofillers, in the appropriate concentration such as to obtain the desired electromagnetic properties. Typically, the GNPs are produced starting from commercial GICs or produced starting from natural graphite or kish, by thermal expansion and reduction in air, with a rate of heating of up to 45000° C./min, at a temperature of from 250° C. to 1500° C., and expansion times that vary as a function of temperature from 2 s to 120 s. The GNPs are constituted by layers of graphene laid on top of one another, in a number ranging from 1 to 70, and with thicknesses comprised between 0.335 nm to 25 nm approximately. The step of thermal expansion and reduction leads to the formation of thermally exfoliated graphite oxide (in what follows, referred to as "TEGO"), which is mixed in a suitable solvent. The suspension thus obtained is subjected to ultrasound treatment in order to obtain exfoliation of the layers of the TEGO and production of GNPs.

The GNPs are uniformly distributed and finely dispersed without formation of clusters and aggregates within the entire mass of the composite, through an appropriate process of mixing that constitutes a peculiar characteristic of the present invention.

The polymeric matrices that can be used for the formulations are thermosetting or thermoplastic polymers; as thermosetting polymers there may be used epoxy resins, phenolic resins, amide resins, polyurethane resins, unsaturated polyester resins, silicone resins, alkyl resins, and vinyl ester resins; among the thermoplastic polymers there may be used polyolefin polymers, amongst which polypropylene, polyethylene, polystyrene, polyurethanes, or thermoplastic resins, amongst which acrylic resins, polycarbonates, fluoropolymers, etc.

The polymer that constitutes the matrix markedly conditions the methodology of preparation of the nanocomposite and the choice of the solvent used in the step of exfoliation of the TEGO.

Non-limiting examples of solvents are acetone, DMF, an appropriate mixture of the two in amounts indicatively ranging between 5 and 15 parts out of 100 of DMF, and accordingly between 95 and 85 parts out of 100 of acetone.

The conditions of curing typically depend upon the type of polymer, the type of solvent, and the concentration of GNPs.

The description of the invention will be better understood with reference to the attached plates of drawing, which illustrate by way of non-limiting example a preferred embodiment thereof.

LIST OF THE DRAWINGS

Figure 3:
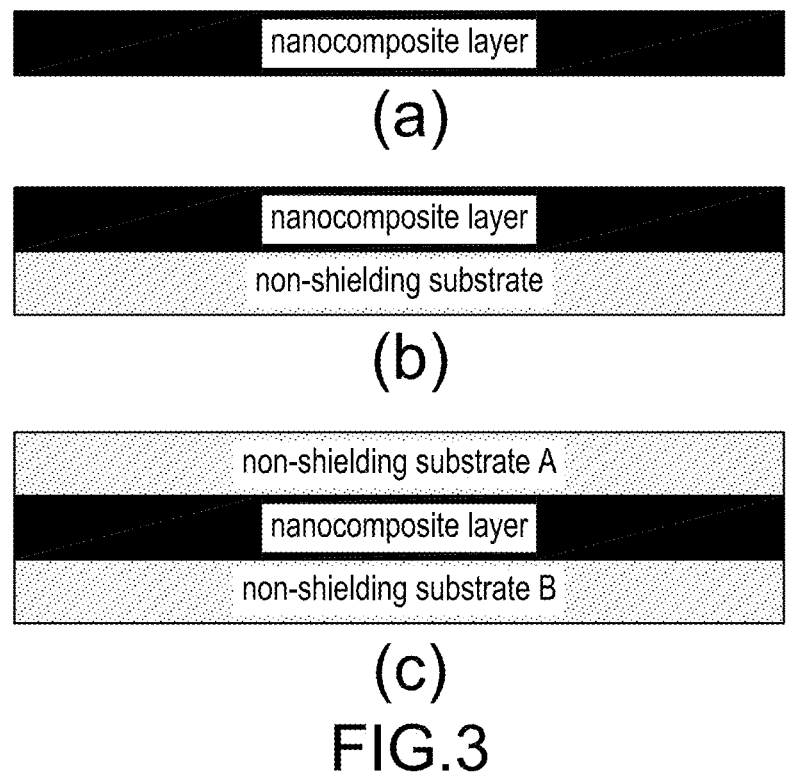
Figure 4:
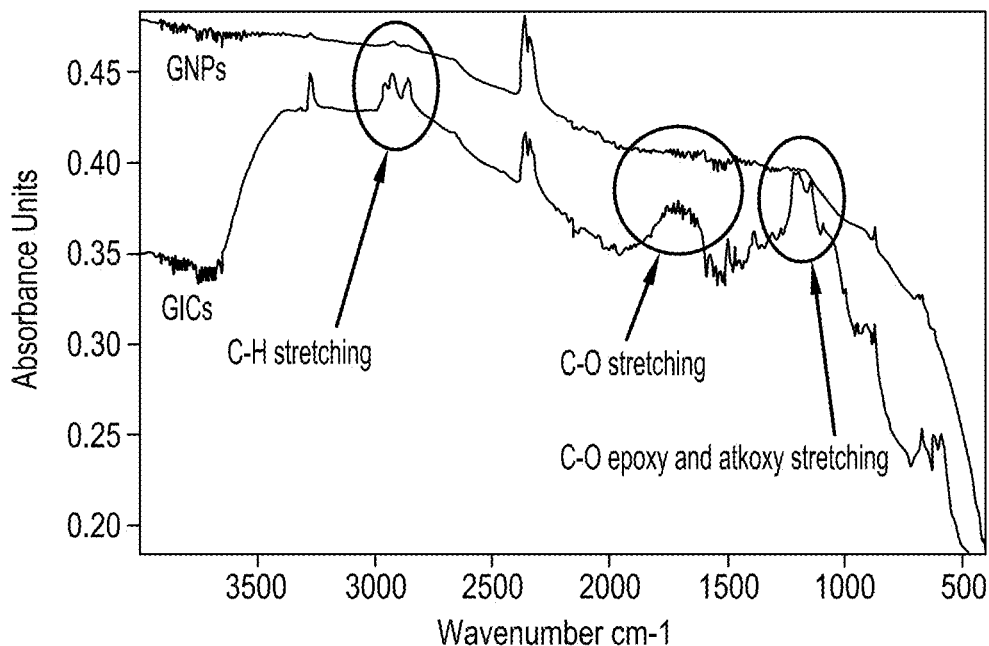
Figure 5A:
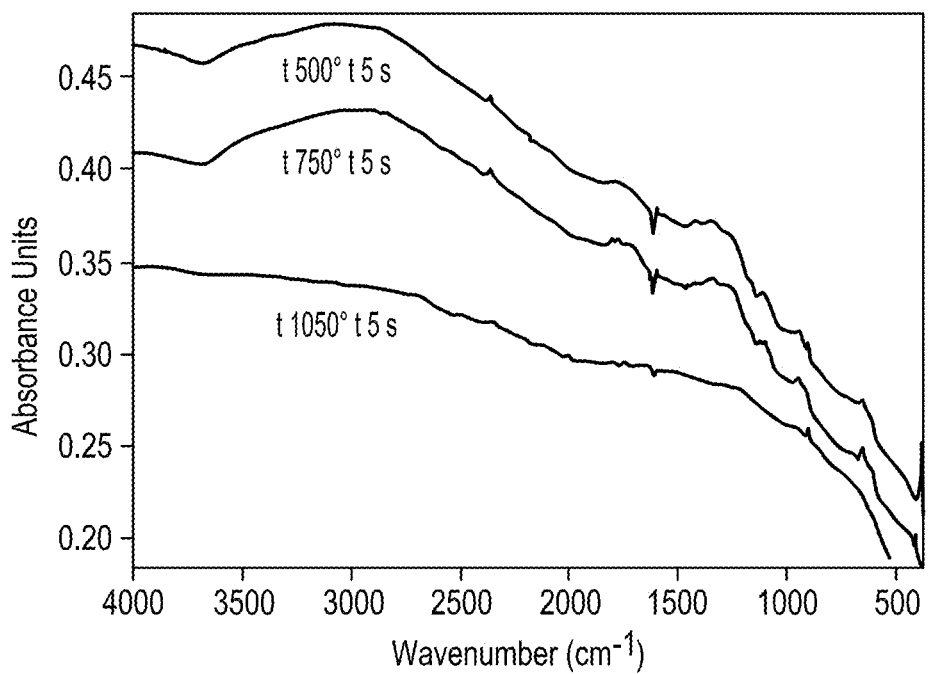
Figure 5B:
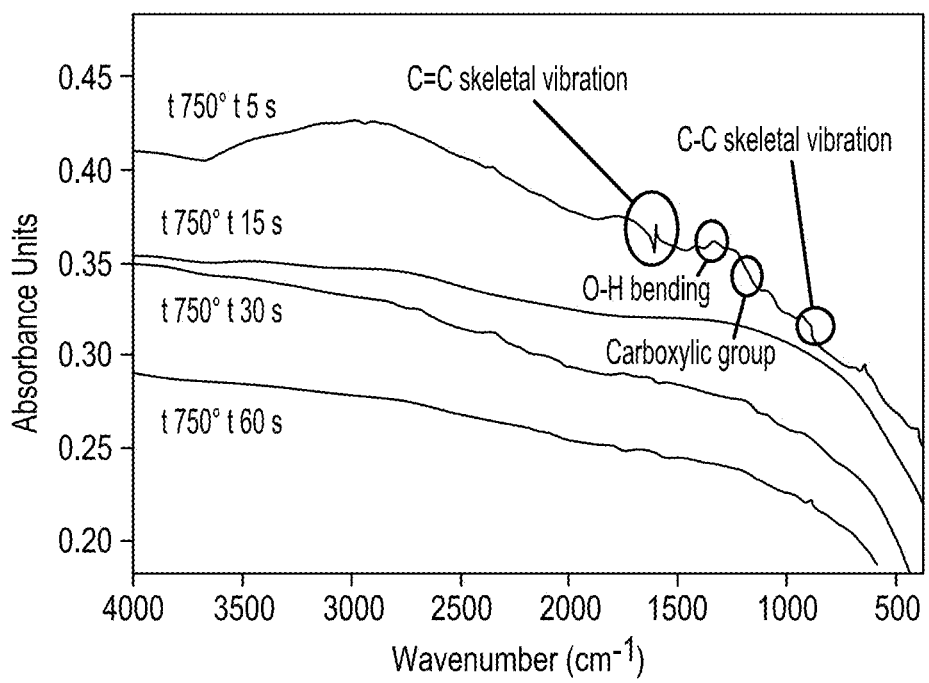
Figure 6:
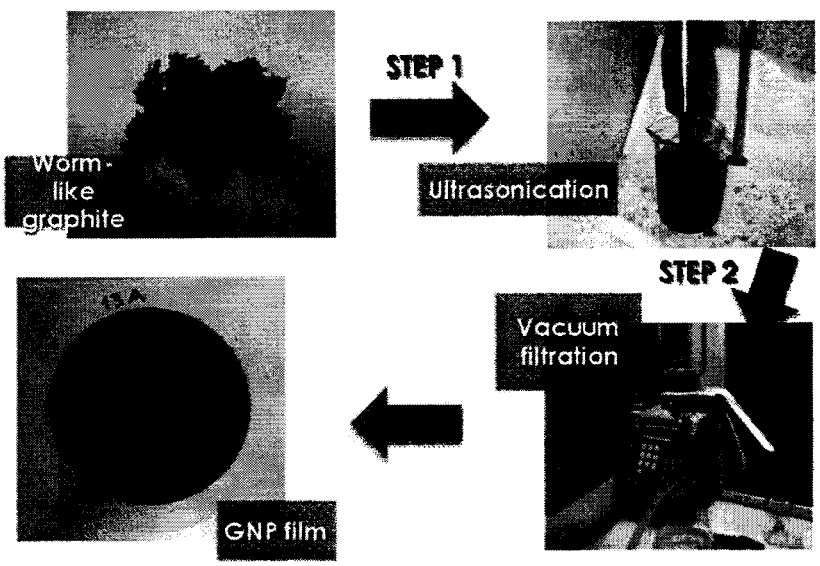
Figure 7:
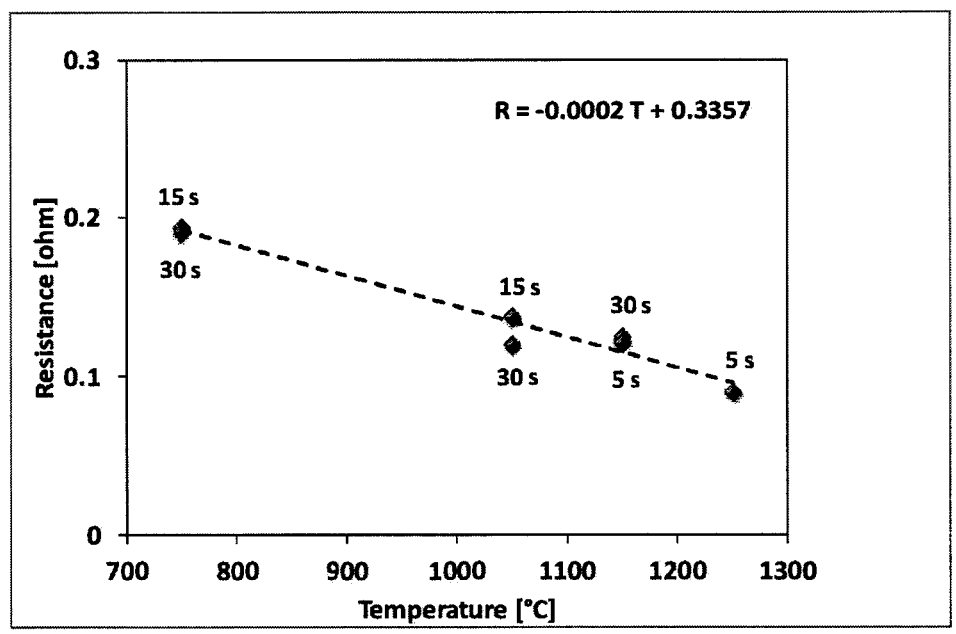
Figure 8:
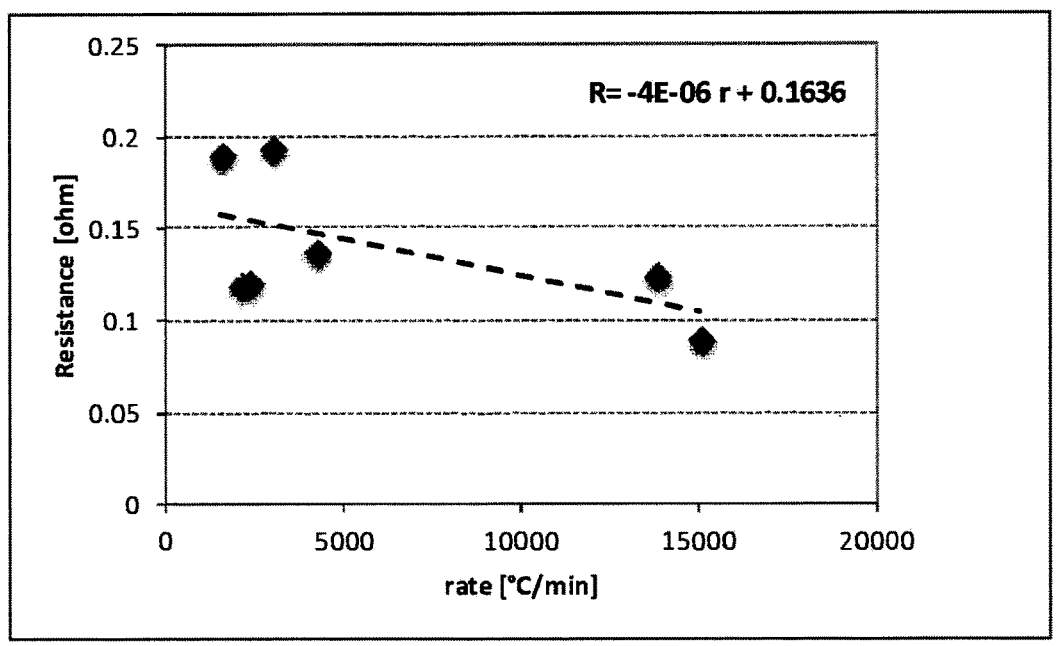
Figure 9:
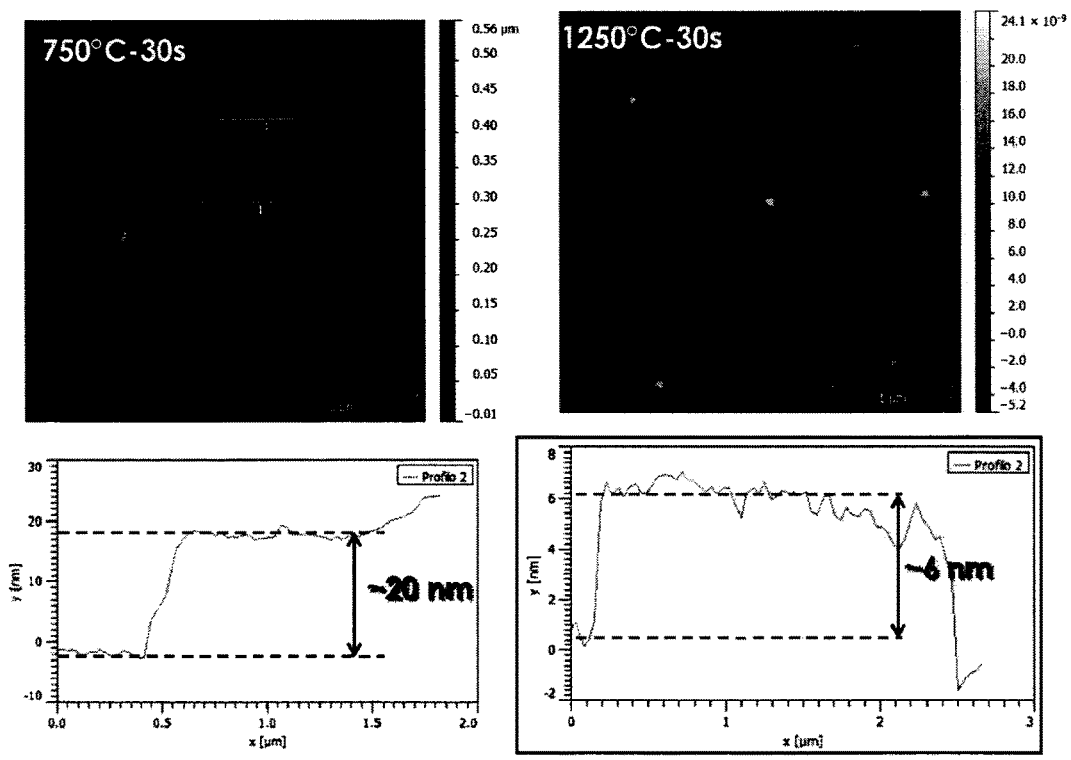
Figure 10:
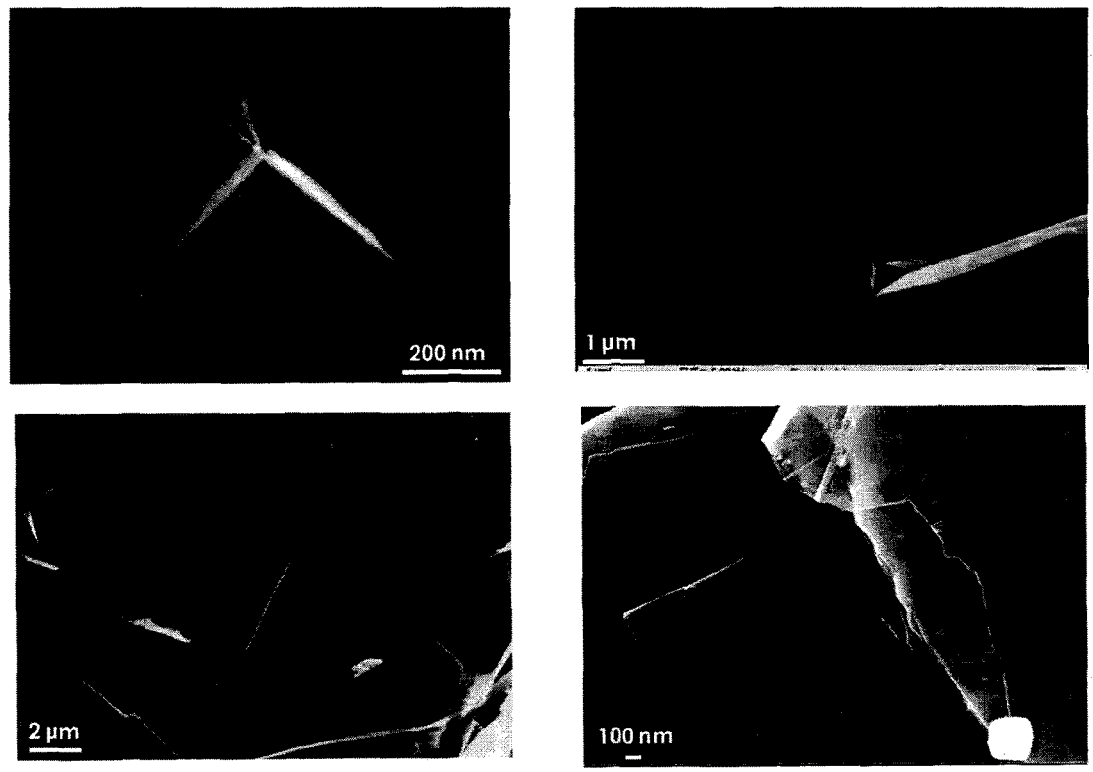
Figure 11:
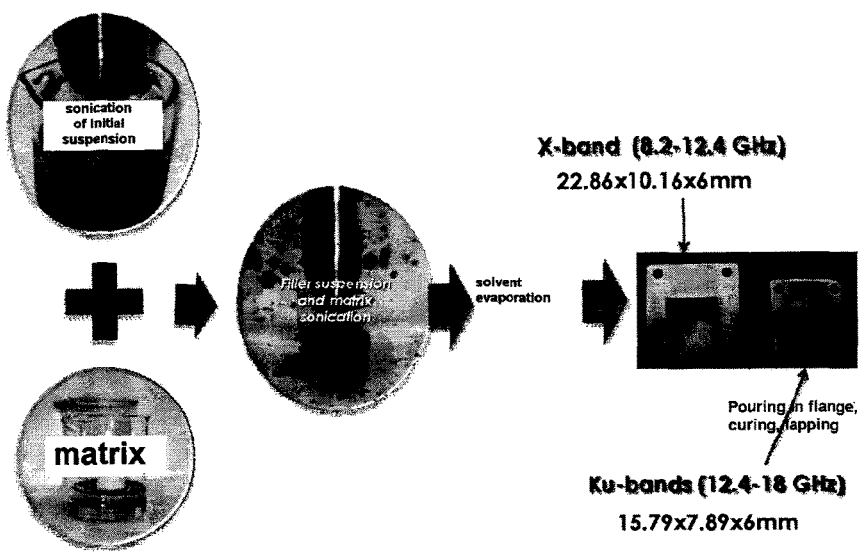
Figure 12:
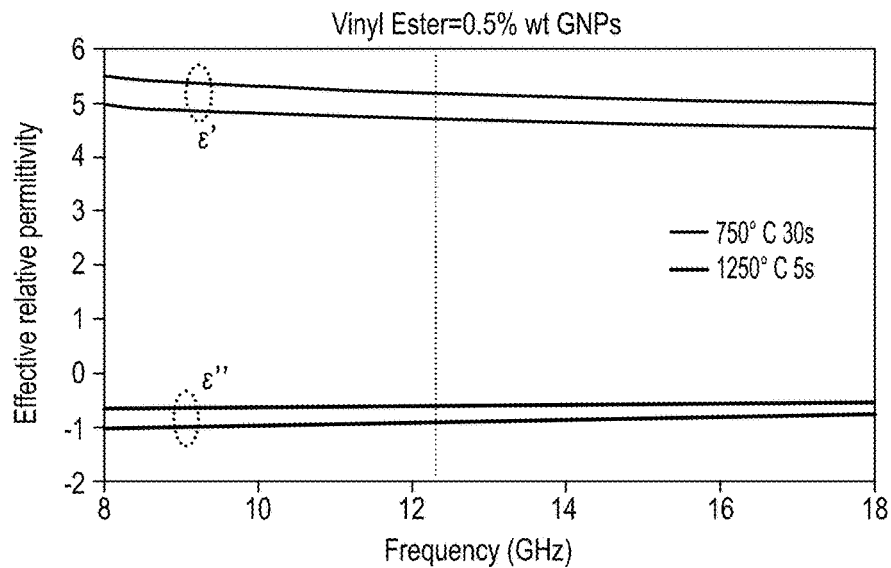
Figure 13:
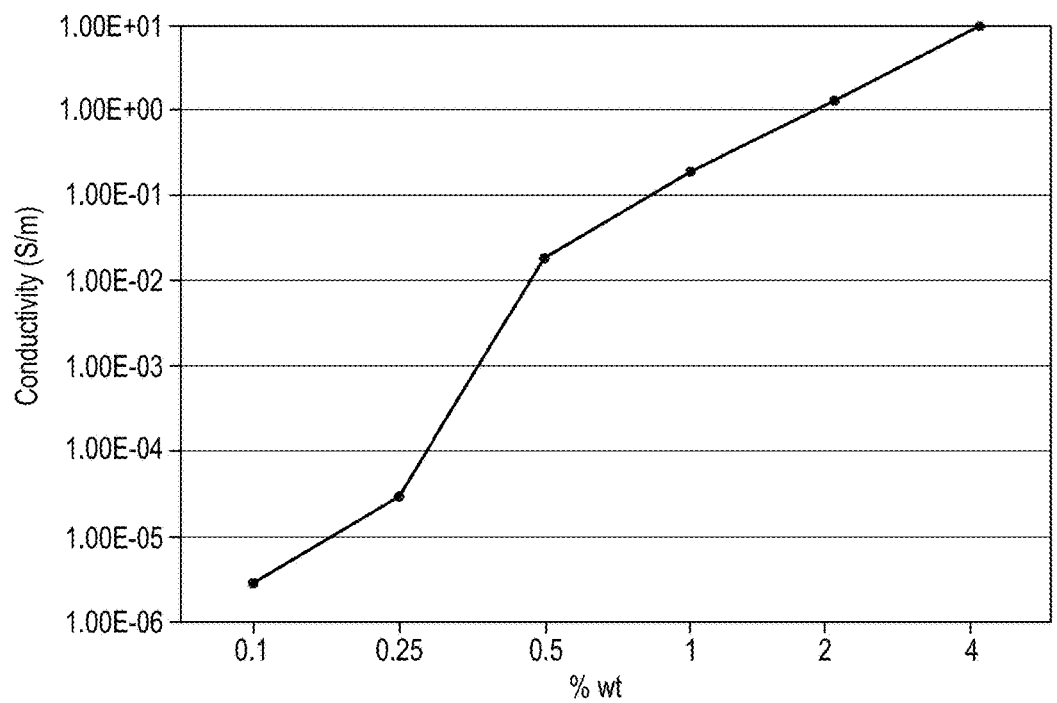
Figure 14:
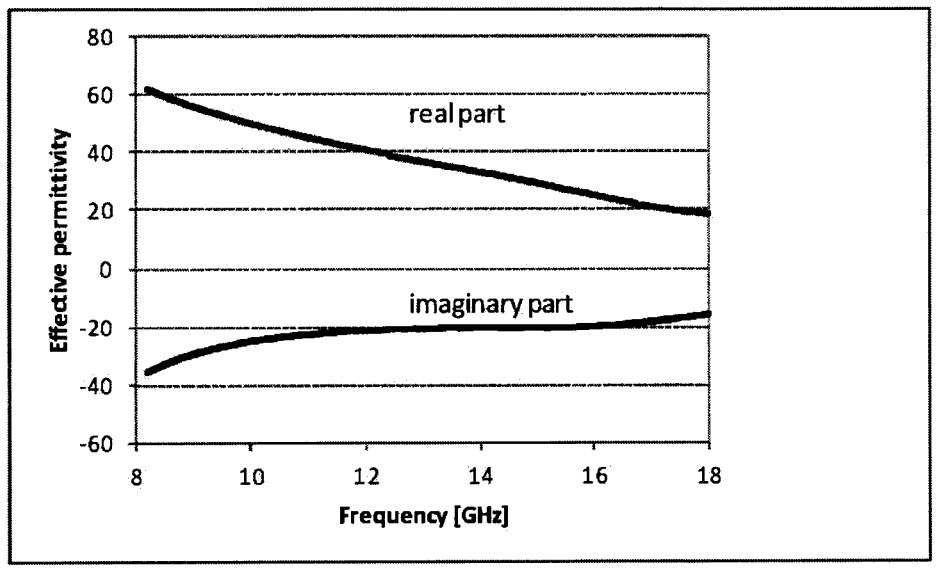
Figure 15:
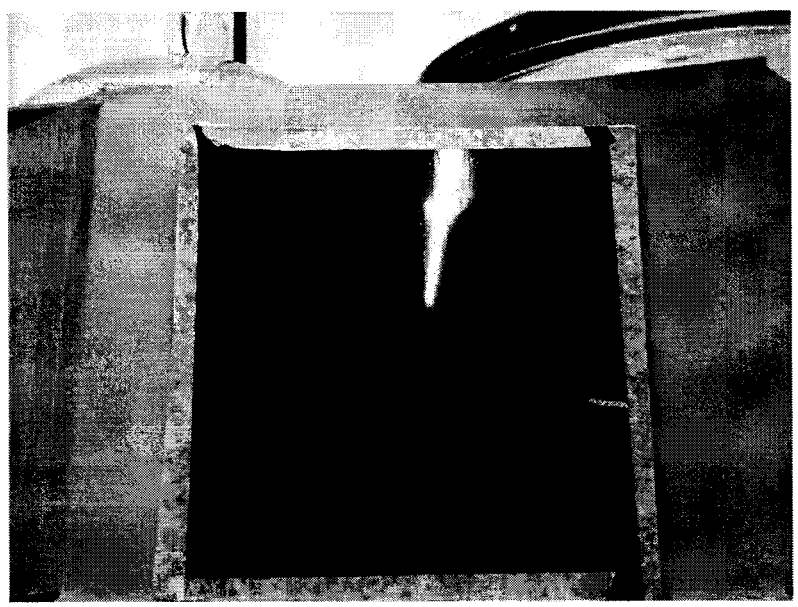
Figure 16:
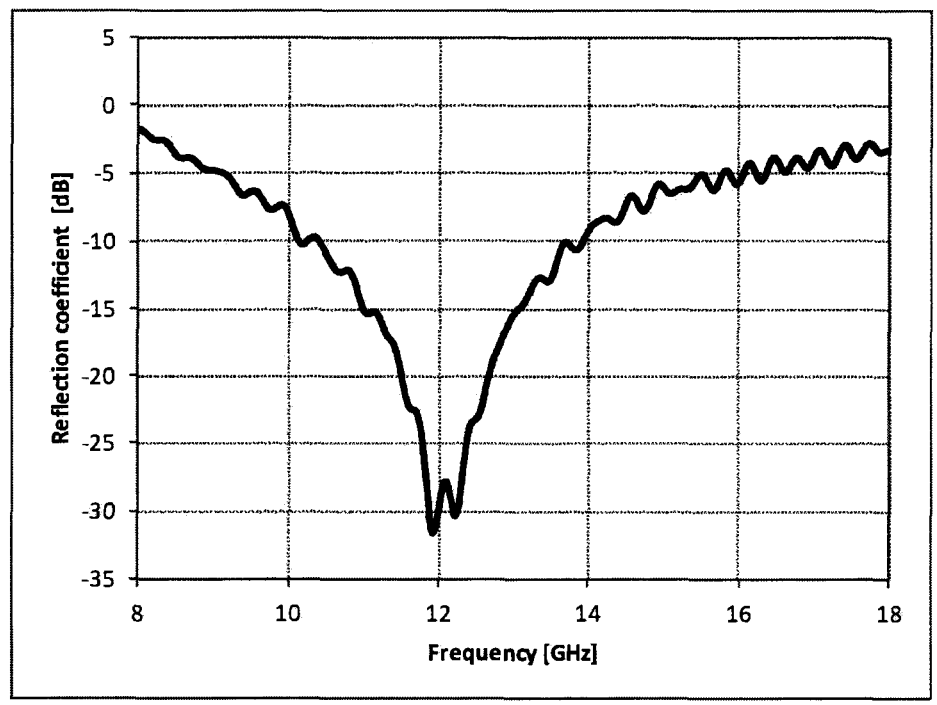
Figure 17:
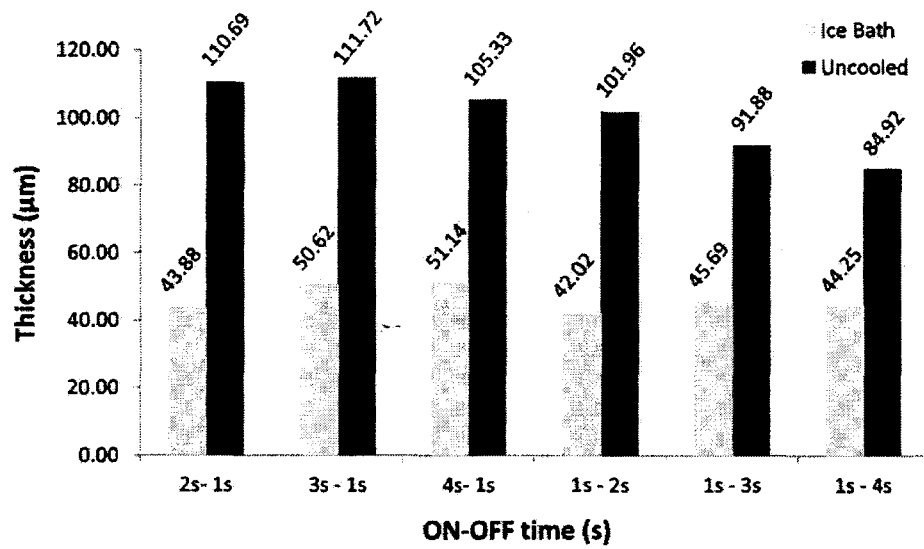
Figure 18:
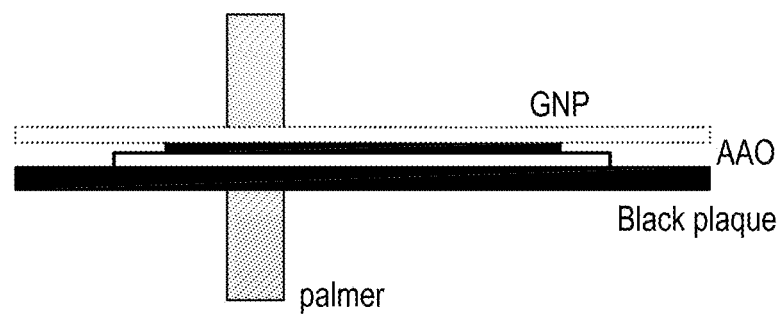
Figure 19:
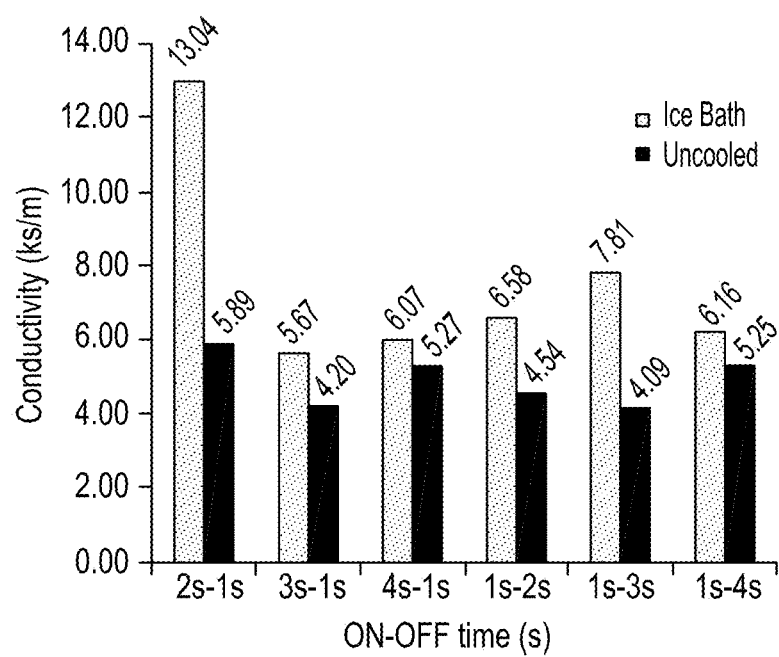

FIGS. 3a, 3b, and 3c are schematic illustrations of the cross sections of panels made of nanocomposite to be used as material for shielding electromagnetic radiation, according to different embodiments;

FIG. 4 shows the results of a FTIR analysis (Fourier-transform infrared spectroscopy) on the residual functional groups containing oxygen and hydrogen after the step of expansion of the graphite-intercalation compounds (GICs);

FIGS. 5a and 5b show the FTIR spectra in the IR medium, which indicate the progressive reduction of the residual functional groups of FIG. 4 as a function of the conditions of expansion of the GICs (in particular time and expansion temperature);

FIG. 6 is a schematic illustration of the production of thick films of GNPs by vacuum filtration on nanoporous membranes of alumina;

FIG. 7 shows the resistance of the GNP films measured using the four-point probe technique, as a function of the expansion temperature, through the thermal regression line obtained by interpolation of experimental data;

FIG. 8 shows the resistance of the GNP films as a function of the expansion rate, defined as ratio between the temperature and the expansion time, through the regression line obtained by interpolation of experimental data;

FIG. 9 is an atomic-force microscopy (AFM) that shows the variation of the thickness of the GNPs as the expansion temperature varies;

FIG. 10 shows SEM (scanning electron microscope) images of GNPs;

FIG. 11 is a schematic illustration of the procedure, known as "solution processing", used for producing the nanocomposites;

FIG. 12 shows the plot of the complex dielectric permittivity of composites obtained with GNPs synthetized in different conditions of expansion of the GICs;

FIG. 13 shows the percolation curve measured in d.c.;

FIG. 14 shows the electrical permittivity for a nanocomposite as a function of the weight percentage of GNPs;

FIG. 15 shows the radar-absorbent panel of Example 3;

FIG. 16 is a graph that illustrates the values of the reflection coefficient of the panel, measured in free space for normal incidence, in Fraunhofer zone, with the −3 dB beam entirely contained in the panel;

FIG. 17 is a histogram that shows the variation of the thickness of the GNP films obtained starting from 20 mg of TEGO, as a function of the type of cycle used and of the control in temperature during the process;

FIG. 18 shows the system used for the measurements of thickness of the films via a micrometer 5 with a 6-mm spindle, using a system of polymeric films; and FIG. 19 is a histogram that gives the mean values of the measurements of thickness of the film repeated in six different points of the specimen, as a function of the sonication cycle used (ON and OFF steps) for the production of the GNPs.

PRODUCTION PROCESS

Figure 1:
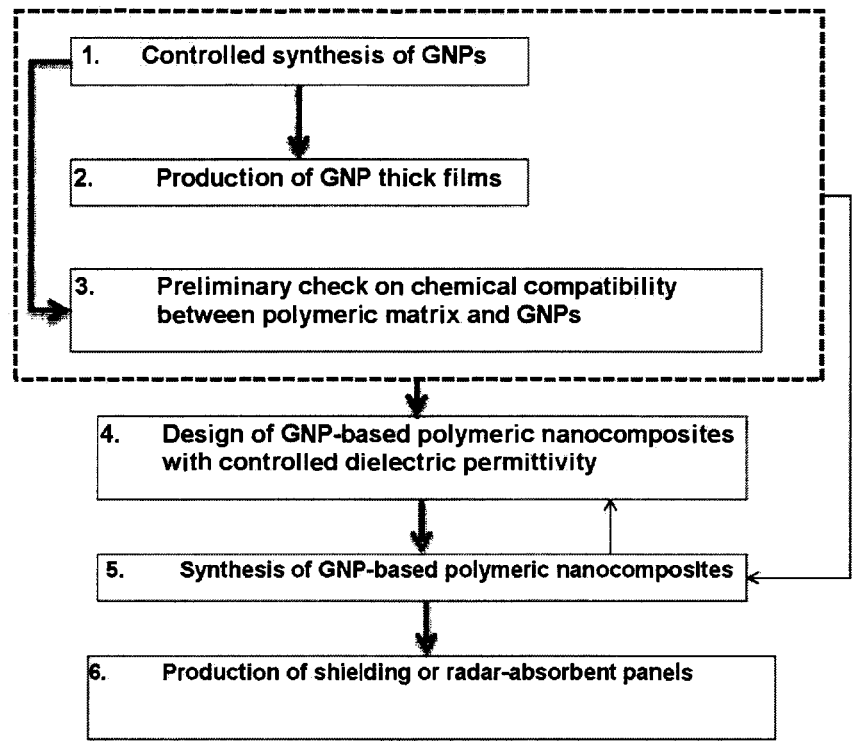
FIG. 1 shows a flowchart of the process of production of radar-absorbent and/or shielding panels.

The production process is summarized in the process steps described in what follows, represented schematically in FIG. 1.

1. Controlled synthesis of GNPs by means of:
a) Expansion and reduction using a thermal process in air. Expansion temperatures and times depend upon the dimensions of the GNPs that can be obtained, and range between 250° C. and 1500° C. and between 2 s and 120 s, respectively.
b) Dispersion in solution. The type of solvent depends upon the dimensions of the GNPs that can be obtained and upon the type of polymer selected for producing the nanocomposites. By way of non-limiting example, acetone, DMF, THF, appropriate mixtures of the foregoing matching Hansen's parameters of graphite to improve expanded graphite solubility in the organic solvent mixture.
c) Sonication with ultrasound tip. The amplitude of oscillation of the tip in this step, expressed as percentage of the maximum amplitude, may be adjusted from 20% to 100% (preferably, by way of non-limiting example, 70%), depending upon the concentration and dimensions of the GNPs that can be obtained. The ON-OFF cycle may be adjusted between 1 s ON-2 s OFF and 4 s ON-1 s OFF, in relation to the electrical and morphological characteristics of the GNPs that can be obtained, with a preferred value, provided by way of non-limiting example, of 2 s ON-1 s OFF. The temperature of the solution is kept constant during the sonication step at a value typically depending upon the solvent used, with a preferred value, provided by way of non-limiting example, of 15° C. for an acetone/DMF solution in a 9:1 ratio.
d) Morphological characterization by means of SEM, AFM, and TEM.
e) Chemical/structural characterization by means of: FTIR, XRD, and XPS.

2. Production of GNP thick films by means of vacuum filtration of the GNP-based suspension for measurements of electrical resistance of the GNPs and calibration of the predictive model of percolation of the GNP-based composite material by tunnelling (Physical Review B, vol. 81, No. 15, 2010):

$$\gamma(\theta) = \gamma_0 \exp[-2\delta(\theta)/\xi] \quad (1)$$

where $\theta$ is the concentration (in wt %) of the GNPs in the composite, $\delta(\theta)$ is the mean distance between the particles of GNPs evenly distributed in the composite in the concentration $\theta$, $\xi = 9.22$ nm is the characteristic tunnelling length, $\gamma_0$ is the limit value of conductivity in the case where $\gamma$ tends to zero. In the present disclosure $\gamma_0$ is calculated using the following expression:

$$\gamma_0 = 1/(R_{sheet} d) \quad (2)$$

where $R_{sheet}$ is the sheet resistance of the GNP film, and d the mean thickness thereof.

3. Preliminary check on chemical compatibility between polymeric matrix and GNPs by means of FTIR analysis of nanocomposite specimens produced according to the procedure referred to in point 5. This check enables selection of the appropriate matrix that favours electronic transport with the filler, and is a fundamental step for final control of the electromagnetic properties of the material according to the method described in point 4.

4. Design of GNP-based polymeric nanocomposites with controlled dielectric permittivity. The design of the GNP-based nanocomposite is made via the equivalent-effective-medium model, previously developed by the present applicants (IEEE Trans. on EMC, vol. 54, No. 1, 2012, pp. 17-27), whereby the nanocomposite is modelled as a composite containing two different types of fillers: oblate ellipsoids (which represent the interaction at a macroscale between the matrix and the lateral surface of the GNPs) and cylinders (which represent the interaction at a nanoscale between the matrix and the edges of the GNPs). The effective complex permittivity of the composite is calculated as $$\varepsilon_{eff} = \varepsilon_{obi} + \frac{\varepsilon_{obi}\theta_{rod}(\sigma_{rod}/j\omega - \varepsilon_{obi}) \sum_{k=1}^{3} \frac{1}{\varepsilon_{obi} + N_{rod,k}(\sigma_{rod}/j\omega - \varepsilon_{obi})}}{3 - \theta_{rod}(\sigma_{rod}/j\omega - \varepsilon_{obi}) \sum_{k=1}^{3} \frac{N_{rod,k}}{\varepsilon_{obi} + N_{rod,k}(\sigma_{rod}/j\omega - \varepsilon_{obi})}} \quad (3)$$

in which:

$$\varepsilon_{obi} = \varepsilon_m + \frac{\varepsilon_m\theta_{obi}(\sigma_{obi}/j\omega - \varepsilon_m) \sum_{k=1}^{3} \frac{1}{\varepsilon_m + N_{obi,k}(\sigma_{obi}/j\omega - \varepsilon_m)}}{3 - \theta_{obi}(\sigma_{obi}/j\omega - \varepsilon_m) \sum_{k=1}^{3} \frac{N_{obi,k}}{\varepsilon_m + N_{obi,k}(\sigma_{obi}/j\omega - \varepsilon_m)}} \quad (4)$$

where $\in_m$ is the dielectric permittivity of the polymeric matrix; $\omega$ is the angular pulsation expressed in rad/s; j denotes the imaginary unit;

$$\theta_{obi} = \left(1 + \frac{\rho_{GNP}}{\rho_m}\theta_{GNPwt}^{-1}\right)^{-1} \quad (5)$$

where $\rho_{GNP}$ is the density of the GNPs (typically 2.15 g/cm$^3$), $\rho_m$ is the density of the polymeric matrix (for vinylester resin, typically 1.2 g/cm$^3$), and $\theta_{GNP,wt}$ is the fraction in weight of the GNPs; $\sigma_{obl}$ depends upon the pulsation $\omega$ according to the following relation:

$$\theta_{obi}(\omega) = \frac{\sigma_{0GNP}}{1 + j\omega\tau_{GNP}} \quad (6)$$

where $\sigma_{0GNP}$ is the value of d.c. electrical conductivity obtained as per step 2 and $\tau_{GNP} = 0.189$ ps;

$$\theta_{rod} = \alpha\theta_{obl} \quad (7)$$

where $\alpha$ depends upon the morphology of the GNPs and is typically comprised between 0.05 and 0.5, with a preferred value, by way of non-limiting example, of 0.13 for GNPs expanded at 1150° C. for 5 s;

$$\sigma_{rod} = \beta\sigma_{obl} \quad (8)$$

where $\beta$ depends upon the morphology of the GNPs and is typically comprised between 0.1 and 0.8, with a preferred value, by way of non-limiting example, of 0.38 for GNPs expanded at 1150° C. for 5 s;

$$N_{obl,3} = e_{obl}^{-3}(1 + e_{obl}^2)(e_{obl} - a \tan e_{obl}) \quad (9)$$

$$N_{obl,1} = N_{obl,2} = (1 - N_{obl,3})/2 \quad (10)$$

where:

$$e_{obl} = \sqrt{\langle A \rangle / \langle d \rangle^2 - 1} \quad (11)$$

where $\langle A \rangle$ is the mean surface of the GNPs and $\langle d \rangle$ the mean thickness;

$$N_{rod,1} = (k\langle d \rangle / \sqrt{\langle A \rangle})^2 \ln[2\sqrt{\langle A \rangle}/(k\langle d \rangle)] \quad (12)$$

$$N_{rod,2} = N_{rod,3} = 1/2 \quad (13)$$

where k depends upon the morphology of the GNPs and is typically comprised between 2 and 8, with a preferred value, by way of non-limiting example, of 4.66 for GNPs expanded at 1150° C. for 5 s.

The parameters of the model are calibrated for the specific type of polymeric matrix and the specific type of GNPs used, the chemical compatibility of which is ascertained by means of FTIR analysis.

5. Synthesis of GNP-based polymeric nanocomposites by means of the solution-processing technique. By way of non-limiting example, the procedure is described in what follows with reference to a thermosetting matrix:

a) The suspension of GNPs in acetone, previously subjected to treatment as described in (1a-c), is added with the thermosetting polymer in appropriate weight percentage, previously added with accelerator for the types of resins that require it, such as, by way of non-limiting example, the vinylester resin considered in Example 2.

b) The new formulation obtained is subjected to sonication with ultrasound processor in continuous regime for 30 s, and with amplitude comprised between 40% and 70% of the maximum amplitude, as a function of GNP concentration.

c) The mixture is subjected to magnetic stirring, possibly assisted by the action of a suction hood or by vacuum, in order to control appropriately the rate of evaporation of the solvent. The appropriate definition of the suction rate of the hood or of the level of vacuum to be applied during the mixing step, in relation to the concentration of GNPs in the solution, must guarantee a variable duration of the process comprised between 0.5 and 24 h (corresponding to an evaporation rate comprised between 0.05 ml/min and 0.2 ml/min, and preferably of 0.11 ml/min for GNP weight concentration of 2%), in order to prevent formation of clusters and aggregates of GNPs and trapping of molecules of solvent in the mixture. Magnetic stirring is performed using an appropriate device designed to impart on the magnetic anchor a motion of revolution in addition to rotation about its own axis. This measure prevents formation of aggregates of GNPs in the mixture.

d) At the end of complete evaporation of the solvent, the mixture is added with appropriate hardening agent in a fixed concentration, and is further mixed with a magnetic stirrer for a time ranging between 2 and 10 min, as a function of the concentration of the GNPs in the mixture.

e) The final mixture is poured into moulds shaped according to the final application, which have been previously coated with a detaching agent (such as for example PVA).

f) The curing step envisages a period comprised between 4 h and 48 h in air and subsequently between 4 h and 48 h in an oven at a temperature of between 50° C. and 120° C., in relation to the type of polymer, solvent used, and GNP concentration. By way of non-limiting example, for vinylester resin, suspension of GNPs in acetone, and concentration of GNPs over the weight of resin of between 0.1 wt % and 1 wt %, the curing step lasts 24 h in air followed by 24 h in an oven at 70° C.

g) After curing, the nanocomposites produced undergo lapping, if necessary, and conditioning in a controlled atmosphere.

Figure 2:
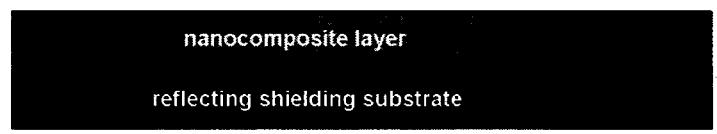
FIG. 2 is a schematic cross-sectional view of a RAM panel formed by a layer made of nanocomposite and by a reflecting shielding substrate.

6. Production of shielding or radar-absorbent panels obtained by pouring the mixture referred to in point 5d into an appropriately shaped mould, with a mask appropriately sized for obtaining the desired thickness, typically comprised between 0.1 and 3 mm and more precisely in the region of 1 mm or less with reference to a frequency range between 6 and 18 GHz. For use as radar-absorbent material (RAM), the panel made of nanocomposite is glued on a shielding conductive substrate, which, by way of non-limiting example, may be constituted by an aluminium panel, laminated with carbon fibre having a shielding efficiency higher than 70 dB, according to the schematic representation of FIG. 2. To obtain particular wide-band performance, RAM panels may be made of a multilayer of GNP-based nanocomposites with different concentrations, glued on a reflecting shielding substrate. For use as shielding material, the panel made of nanocomposite is used in self-standing mode, or else is glued on a substrate that does not provide a shield against radiofrequency electromagnetic radiation, or else is sandwiched between two layers of material that do not provide a shield against radiofrequency electromagnetic radiation, as shown, respectively, in the schematic representations (a), (b), and (c) of FIG. 3.

EXAMPLES OF PRODUCTION PROCEDURES

Example 1

Controlled synthesis of GNPs (control of the lateral dimensions, thickness of the flakes, aspect ratio, d.c. conductivity, and degree of surface oxidation) starting from graphite-intercalation compounds (GICs). The GICs may be either commercially available ones (for example, manufactured by Graphtech Inc. or Asbury Carbons) or else prepared following one of the processes indicated in the literature (principally, modified Hummers and Staudenmaier) starting from natural graphite or graphite of a kish type.

Description of the Typical Procedure of Synthesis of Graphite Nanoplatelets (GNPs)

1) commercial GICs (Graphguard 160-50N produced by Graphtech Inc.) are expanded in a muffle oven in air at temperatures ranging between 750° C. and 1250° C. The duration of the step of expansion may range between 5 and 60 s, depending upon the temperatures used: by way of example, at the temperature of 1250° C., the maximum duration of the expansion is 15 s. At the end of the expansion in an oven the GICs assume a worm-like shape, expanding along the axis c of the GIC (in a direction orthogonal to the base layers) with an increase in volume in this direction that may reach beyond 500 times the initial volume. The products thus obtained are referred to as "thermally expanded graphite oxides" (TEGOs).

2) The TEGOs are subjected to ultrasound treatment in appropriate solvent (DMF, NMP, THF, acetone, water, mixtures of the foregoing, etc.), using an ultrasound processor with a power of up to 750 W (Sonics & Materials Vibra cell VC 505 and VCX 750). The treatment is performed in pulsed regime, to prevent overheating, and the duration is varied as a function of the type of cycle set. In particular, the duration of the individual ON-OFF steps of the cycle may range between 1 and 4 s for each. Moreover the temperature of the suspension, during the sonication step, may be controlled by means of an external-recirculation bath in order to keep the ultrasound tip in resonance conditions throughout the duration of the process. The DC conductivity of the GNPs produced may be controlled 20 between values typically comprised between 100 Sm and 106 Sm by varying appropriately the duration of the ON-OFF steps, and controlling the temperature of the suspension.

The GNPs are characterized from the structural-morphological standpoint, using SEM, TEM, AFM, XRD, and FTIR. In particular, from the microscopic analyses, it emerges that it is possible to control the dimensions of the GNPs by appropriately varying the process parameters within the limits indicated in (1), to obtain thicknesses of between 0.335 and 25 nm and lateral dimensions of between 0.5 and 20 μm. FTIR analysis (FIG. 4) has enabled confirmation of the possibility of controlling the type and density of residual functional groups containing oxygen and hydrogen (hydroxyl groups, carboxyl groups, epoxy groups, etc.) after the step of expansion of the GICs. By way of example FIGS. 5(*a*) and 5(*b*) show the FTIR spectra in the IR medium, which indicate the progressive reduction of the aforementioned residual functional groups, as the time and the temperature of expansion of the GICs, respectively, vary. By varying the parameters listed in (1) and (2) it is moreover possible to control the d.c. electrical conductivity of the GNPs, which is measured on thick films of GNPs produced by vacuum filtration on nanoporous alumina membrane (FIG. 6).

With reference to FIG. 7, the resistance of the GNP films, measured using the four-tip technique, is expressed analytically as a function of the expansion temperature, through the regression line obtained by interpolation of the experimental data $$R = -0.0002T + 0.3357 \tag{14}$$

where T is expressed in degrees centigrade and R in ohms.

The resistance of the GNP films is also expressed analytically as a function of the expansion rate, defined as ratio between temperature and expansion time, through the regression line obtained by interpolation of the experimental data (see FIG. 8)

$$R = +4.10^{-6}r + 0.1636 \tag{15}$$

where r is expressed in degrees centigrade/min and R in ohms.

The use of Eqs. (14) and (15) enables the choice of the temperature or of the rate of expansion on the basis of the desired electrical properties of GNPs.

The AFM (atomic-force microscope) images show the variation of the thickness of the GNPs as the expansion temperature of the GICs varies (FIG. 9). The morphology of the GNPs is shown by the SEM images of FIG. 10.

Example 2

Synthesis of polymeric-matrix nanocomposites with controlled electrical and electromagnetic properties (control of the d.c. conductivity of the nanocomposites and of the effective complex permittivity at radiofrequency). Once the suspension of the GNPs in appropriate solvent (generally acetone) has been created via ultrasound tip and with an appropriate concentration, the suspension is added with a polymer (vinylester resin, epoxy resin, PDMS, etc.), the solvent is evaporated under vacuum-assisted magnetic or mechanical stirring, poured into a mould, and cured. The procedure used for producing the nanocomposites is known as "solution processing" and is illustrated schematically in FIG. 11.

Description of the Typical Procedure of Production of Nanocomposites

1) A suspension of GNPs in acetone, previously subjected to treatment with ultrasound processor, as described in point 2 of Example 1, is added with vinylester resin (DION 9102 produced by Reichhold), to which a Co-based accelerator has been previously added, in a ratio of 0.2 wt %. The amplitude of oscillation of the tip in this step, expressed as percentage of the maximum amplitude, may be adjusted between 20% to 100% (preferably 70%), depending upon the concentration and dimensions of the GNPs that can be obtained.

2) The new formulation obtained is subjected to sonication with ultrasound processor in continuous regime for 30 min, and with an amplitude of less than 40% of the maximum amplitude so as to limit formation of bubbles.

3) The mixture is subjected to magnetic stirring, vacuum-assisted in order to accelerate evaporation of the solvent. The procedure has a duration ranging between 0.5 and 24 h, depending upon the level of vacuum chosen and upon the concentration of the initial suspension of GNPs in acetone. Advantageously, magnetic stirring is performed using a device designed to impart on the magnetic anchor a motion of revolution in addition to rotation about its own axis. This measure prevents formation of agglomerates of GNPs in the mixture.

4) At the end of complete evaporation of the solvent, the mixture is added with an appropriate hardening agent (Butanox LPT produced by Akzo Nobel) in a ratio of 2 wt % and further mixed with a magnetic stirrer for a time ranging between 2 and 10 min.

5) The final mixture is poured into moulds shaped according to the final application, which have previously been coated with a detaching agent (such as for example PVA).

6) The curing step envisages 24 h in air and 24 h in an oven at 70° C.

7) After curing, the nanocomposites produced undergo lapping, if necessary, and conditioning in a controlled atmosphere.

The measurement of the complex dielectric permittivity of composites obtained with GNPs synthetized in different conditions of expansion of the GICs is shown by way of example in FIG. 12 for a concentration of GNPs of 0.5%.

The nanocomposites are produced with concentrations of GNPs typically of up to 4% but that may reach 15%.

The percolation curve measured in d.c. appears in FIG. 13. The values of electrical conductivity of the GNP-based nanocomposites vary from approximately $10^{-6}$ S/m to beyond 10 S/m.

The electrical permittivity measured for the nanocomposite with a concentration of GNP fillers of 4% is shown in FIG. 14.

Example 3

Production of a wide-band radar-absorbent panel in the Ku band (12 GHz-18 GHz)

The panel is produced by manual pouring of the resin with GNP fillers in a weight percentage of 2 wt % on a mask, having dimensions 24 cm×24 cm for a thickness of 1.1 mm, made of polypropylene and positioned on a glass surface, appropriately coated with polyvinyl alcohol (PVA), used as detaching agent; next, a sheet of Mylar of the thickness of 0.2 mm is laid in order to render the thickness of the resin uniform with that of the mask. Also in this case, PVA is applied on the Mylar. This operation calls for considerable care, it being necessary to eliminate any possible air bubbles present in the resin containing fillers after pouring on the mould.

Once the operation is completed, there are provided a second plate of glass used as countermould and weights to ensure a better seal. After pouring, a curing cycle is carried out for 24 h in air and subsequently for 24 h in an oven at a temperature of 70° C. to obtain complete polymerization. The nanocomposite panel thus obtained is glued on an aluminium plate of a thickness of 2 mm, using an adhesive layer of a thickness not greater than 100 µm. FIG. 15 shows the panel thus obtained.

The reflection coefficient of the panel is measured in free space for normal incidence, in Fraunhofer zone, with −3 dB beam entirely contained in the panel. The results obtained are shown in FIG. 16.

Example 4

Synthesis of GNP thick films with control of the d.c. conductivity, obtained via monitoring of the sonication parameters, in particular the cycle and the temperature.

As described in Example 1, the GNPs are produced starting from commercial GICs, by expansion in a muffle oven at the temperature of 1150° C. for a duration of 5 s. Next, the TEGOs obtained, are dispersed in an acetone/DMF solution with a volume ratio of 9:1, via ultrasound processor with different cycles, in pulsed regime. The temperature of the suspension is controlled via an external-recirculation bath. The resulting suspensions are filtered in vacuum conditions to obtain thick films of GNPs (of a thickness depending upon the cycle used, the solvent used, and the process temperature) designed for characterization of the d.c. conductivity.

Description of the Typical Procedure of Synthesis of GNP Thick Films with d.c. Conductivity and Thickness Depending Upon the Parameters of the Sonication Cycle 1) Commercially available GICs (Graphguard 160-50N produced by Graphtech Inc.) are expanded in a muffle oven in air at 1150° C. for 5 s. At the end of expansion in an oven, the GICs assume a worm-like shape, expanding along the axis c of the GIC (in the direction orthogonal to the base layers) with increase in volume in said direction that can reach beyond 500 times the initial volume. The products thus obtained are referred to as "thermally expanded graphite oxides" (TEGOs).

2) The TEGOs are subjected to ultrasound treatment in an acetone/DMF mixture with a volume ratio of 9:1, using an ultrasound processor (Sonics&Materials Vibra cell VC 505 and VCX750). The treatment is performed in pulsed regime, to prevent overheating, and the duration is varied according to the type of cycle set. In particular, the duration of the individual ON-OFF steps of the cycle may range between 1 and 4 s for each ON or OFF step. Moreover, the temperature of the suspension, during the sonication step, is controlled by means of an external-recirculation bath in order to keep the ultrasound tip in conditions of resonance throughout the duration of the process. By way of example, using the aforesaid mixture of acetone and DMF for dispersion of the GNPs, the temperature of the bath must be less than 20° C.

3) The resulting suspension is subjected to vacuum filtration using a filter made of nanoporous alumina to obtain films of a thickness comprised between 5 and the 200 μm, depending upon the initial amount of TEGOs and upon the conditions of sonication (type of solvent, temperature of the suspension during the process, type of cycle used). By way of non-limiting example, FIG. 17 shows the variation of the thickness of the films obtained starting from 20 mg of TEGOs, as a function of the type of cycle used (respectively, time of activity and inactivity of the ultrasound tip, expressed in seconds) and of the control of the temperature during in process (in light blue with control, in red without control of the temperature of the suspension). To prevent any indentations of the GNP films, the measurements of thickness are performed with a digital micrometer with a 6-mm-diameter thimble, and using a system of polymeric films, as shown in FIG. 18 (AAO denotes the alumina filter, used as support during the measurements of d.c. conductivity). The measurement is repeated in six different points of the specimen, and the value of the thickness is given by the average of the six measurements.

For the evaluation of the d.c. conductivity of the GNP films the four-tip process is used, repeating the measurement in six different positions. FIG. 19 shows the variation of the mean values of d.c. electrical conductivity measured (in kilosiemens per meter), as a function of the type of cycle used (respectively time of activity and inactivity of the ultrasound tip, expressed in seconds) and of the control of the temperature during in process (in light blue with control, in red without control of the temperature of the suspension).

Innovative Characteristics of the Invention

The main advantages afforded by the present invention regard the possibility of providing high-performance multifunctional polymeric nanocomposites, principally for electrical and electromagnetic applications and for producing panels that are shielding and/or radar-absorbent at radiofrequency, typically in the X and Ku bands, by way of non-limiting example. This result is obtained by synthesizing GNPs with controlled morphological and electrical properties and producing with said GNPs, used as fillers in variable concentrations typically lower than 15%, polymeric-matrix nanocomposites with controlled properties of complex dielectric permittivity at radiofrequency.

The resulting material presents excellent mechanical and thermal characteristics and electrical and electromagnetic properties that can be defined (at the moment of formulation) according to the field of applicability.

The results obtained confirm that the type of dispersion of the GNPs within the polymeric matrix considerably affects the electrical properties of the composite.

In particular, it has been shown that it is possible to obtain high-performance thin radar-absorbent shields for the X and Ku bands with thicknesses of the nanocomposite of approximately 1 mm, characterized by a minimum reflection coefficient of less than −20 dB and a −10 dB band, centred at approximately 13 GHz, of up to 4 GHz.

Main Areas of Application

The multifunctional composites forming the subject of the present invention find application in the production of electromagnetic devices, such as for example shields for control and suppression of radiofrequency electromagnetic interference and radar-absorbent materials for stealth applications. They may consequently be used in the aerospace field, in the automotive field, for packaging electronic devices, and in all applications in which there is required the use of materials with characteristics of lightness and desired properties of electrical conductivity.

In particular, the material forming the subject of the invention is suitable for the production of single-layer or multilayer radar-absorbent shields or of electromagnetic absorbers for radiofrequencies having a base of polymeric materials. It may moreover be used as polymeric matrix for producing composite laminates with controlled electrical conductivity.

REFERENCES

[1] C. P. Neo and V. K. Varadan, "Optimization of carbon fiber composite for microwave absorber," IEEE Trans. on EMC, vol. 46, pp. 102-106, February 2004.

[2] R. A. Tellakula, V. K. Varadan, T. C. Shami, and G. N. Mathur, "Carbon fiber and nanotube based composites with polypyrrole fabric as electromagnetic absorbers," Smart Mater. Struct., No. 13, pp. 1040-1044, July 2004.

[3] A. N. Lagarkov, S. M. Matytsin, K. N. Rozanov, and A. K. Sarychev, "Dielectric properties of fiber-filled composites," Journal of Applied Physics, vol. 84, pp. 3806-3814, October 1998.

[4] Jung-Hoon Oh, Kyung-Sub Oh, Chun-Gon Kim, and Chnag-Sun Hong, "Design radar absorbing structures using glass/epoxy composite containing carbon black in X-band frequency ranges," Composites Part B: engineering, vol. 35, pp. 49-56, January 2004.

[5] Mingzhong Wu, Huahui He, Zhensheng Zhao, and Xi Yao, "Electromagnetic and microwave absorbing properties of iron fiber-epoxy resin composites," Journal of Physics D: Applied Physics, vol. 33, pp. 2398-2401, October 2000.

[6] R. Faez, I. M. Martin, M.-A. De Paoli, and M. C. Rezende, "Microwave properties of EPDM/Pani-DBSA blends," Synthetic Metals, vol. 119, pp. 435-436, March 2001.

[7] M. S. Pinho, M. L. Gregori, R. C. Reis Nunes, and B. G. Soares, "Performance of radar absorbing materials by waveguide measurements for X- and Ku, band frequencies," European Polymer Journal, vol. 38, pp. 2321-2327, April 2002.

[8] S. Marchant, F. R. Jones, T. P. C. Wong, and P. V. Wright, "Free space microwave characteristics of polypirrole coated glass fiber," Synthetic Metals, vol. 96, pp. 35-41, April 1998.

[9] G. E. Pike, C. H. Seager, "Percolation and conductivity: a computer study", Physical review B, Vol. 10 n° 4, 1974: 1421-1434.

[10] D. Toker, D. Azulay, N. Shimoni, I. Balberg, O. Millo, "Tunneling and percolation in metal-insulator composite materials", Physical review B, Vol. 68, 2003.
[11] S. M. Matitsine, K. M. Hock, L. Liu, Y. B. Gan, A. N. Lagarkov e K. N. Rozanov, "Shift of resonance frequency of long conducting fibers embedded in a composite". Journal of Applied Physics, 94(2), July 2003, pp. 1146-1154.
[12] Sang-Eui Lee, Ji-Ho Kang, Chun-Gon Kim, "Fabrication and design of multi-layered radar absorbing structures of MWNT-filled glass/epoxy plain-weave composites", Composite Structures, vol. 76, pp. 397-405, 2006.
[13] Zhuangjun Fan, Guohua Luo, Zengfu Zhang, Li Zhou, and Fei Wei, "Electromagnetic and microwave absorbing properties of multi-walled carbon nanotubes/polymer composites", Materials Science and engineering B, vol. 132, pp. 85-89, 2006.
[14] Young Seok Song and Jae Ryoun Youn, "Influence of dispersion states of carbon nanotubes on physical properties of epoxy nanocomposites", Carbon, vol. 43, pp. 1378-1385, 2005.
[15] U.S. Pat. No. 5,094,907, Mar. 10, 1992, "Electromagnetic wave absorbing material" (applicazione 0.5 MHz-3 GHz, composito caricato con fibre a base di carbonio di diametro 5-15 micron, percentuali in vol. dell'ordine del 50%-60%).
[16] Sarto, M. S.; D'Aloia, A. G.; Tamburrano, A.; Bellis, G. D., "Synthesis, Modeling, and Experimental Characterization of Graphite Nanoplatelet-Based Composites for EMC Applications," IEEE Transactions on Electromagnetic Compatibility, vol. 54, No. 1, pp. 17-27, February 2012.
[17] G. De Bellis, A. Tamburrano, A. Dinescu, M. L. Santarelli, and M. S. Sarto, "Electromagnetic properties of composites containing graphite nanoplatelets at radio frequency", Carbon, November 2011; Vol. 49, No. 13, 2011, pp. 4291-4300
[8] U.S. Pat. No. 5,554,678, 1996 Sep. 10, "Electromagnetic shielding composite".
[9] U.S. Pat. No. 5,952,953, 1999 Apr. 14, "Wave absorber".
[20] U.S. Pat. No. 6,043,769, Mar. 28, 2000, "Radar absorber and method of manufacture".
[21] Patent No. US2002/0035170 A1, Mar. 21, 2002, "Electromagnetic shielding composite comprising nanotubes"
[2] Patent No. US 2004/23957, Dec. 1, 2004, "Low cost electromagnetic field absorbing devices manufactured from conductive loaded resin-based materials".
[3] Patent No. US2006/0058187 A1, Mar. 16, 2006, "Radar emission absorbing material".
[24] U.S. Pat. No. 7,411,019 B1, Aug. 12, 2008, "Polymer composites containing nanotubes".
[25] Patent No. US 2007/0120100 A1, May 31, 2007, "Conformal coatings comprising carbon nanotubes".
[26] Patent No. US 2008/0057265 A1, Mar. 6, 2008, "Electromagnetic interference shielding structure including carbon nanotubes and nanofibers".
[27] U.S. Pat. No. 6,762,237 B2, Jul. 13, 2004, "Nanocomposite dielectrics".
[28] U.S. Pat. No. 6,936,653 B2, Aug. 30, 2005, "Composite materials comprising polar polymers and single-wall carbon nanotubes".
[29] Patent No. US 2007/0228317 A1, Oct. 4, 2007, "Fabrication of reinforced composite material comprising carbon nanotubes, fullerenes, and vapour-grown carbon fibers for thermal barrier materials, structural ceramics, and multifunctional nanocomposite ceramics".
[30] U.S. Pat. No. 6,818,821 B2, Nov. 16, 2004, "Electromagnetic wave absorption material and an associated device".
[31] U.S. Pat. No. 7,239,261 B2, Jul. 3, 2007, "Electromagnetic wave absorption material and an associated device".
[32] U.S. Pat. No. 7,658,901, Feb. 9, 2010, "Thermally exfoliated graphite oxide".
[33] Patent No. US 2008/0306225 A1, Dec. 11, 2008, "Polymerization method for formation of thermally exfoliated graphite oxide containing polymer".
[34] Patent No. US 2004/0127621 A1, Jul. 1, 2004, "Expanded graphite and products produced therefrom".
[35] Patent No. US 2010/0140792 A1, Jun. 10, 2010, "Graphite nanoplatelets for thermal and electrical applications".
[36] Patent No. US 2012/0164433 A1, Jun. 28, 2012, "Polymer nanocomposite precursors with carbon nanotubes and/or graphene and related thin films and patterning".
[37] U.S. Pat. No. 8,114,373 B2, Feb. 14, 2012, "Method of producing nano-scaled graphene and inorganic platelets and their nanocomposites".

The invention claimed is:

1. A process for producing a polymeric nanocomposite with electrical and electromagnetic properties controlled and predictable by applying the equivalent-effective-medium model, for electromagnetic applications, shielding and/or absorption of the energy associated to electromagnetic fields, comprising the following steps:
  a) carrying out a synthesis of graphene nanoplatelets through liquid phase exfoliation of thermally expanded graphite, modifying, through parameters of the production process, morphological and electrical properties thereof, said parameters of the production being:
    i) a temperature-to-time expansion rate higher than 2000° C./min and up to 45000° C./min;
    ii) a dispersion of thermally expanded graphite in organic solvents or their appropriate mixture matching Hansen's solubility parameters of graphite; and
    iii) sonication with an ultrasound tip at a power in a range of 20%-100%, in pulse mode between 1 s ON-2 s OFF and 4 s ON-1 s OFF, with total ON time of 20 min, at a temperature below a boiling point of the solvent, in a range of 14° C.-20° C. in order to keep the ultrasound tip resonating throughout the dispersion of step ii);
  b) using said graphene nanoplatelets as nanofillers in a polymeric matrix selected on a basis of chemical compatibility with the graphene nanoplatelets, distributing said graphene nanoplatelets and dispersing said graphene nanoplatelets in an entire mass of the matrix in a weight percentage by a magnetic stirring technique which imparts on a magnetic anchor a motion of revolution in addition to a rotation around the magnetic anchor's own axis so as to prevent formation of graphene nanoplatelet aggregates in the mixture during complete solvent evaporation, wherein:
    i) control of the solvent evaporation rate in a range 0.05-0.2 ml/min and corresponding to a total duration between 0.5 and 24 h in order to avoid formation of graphene nanoplatelet aggregates and trapping of molecules of solvent in the nanocomposite,
    ii) utilizing a device adapted to impart on the magnetic anchor a motion of revolution in addition to the rotation around the magnetic anchor's own axis in order to avoid formation of graphene nanoplatelet aggregates and to obtain a dispersion of the nanofiller in the polymer matrix, wherein said mixing process and preventing aggregate formation, produces a nanocomposite in which an imaginary part of an effective permittivity is controlled independently of a real part through a nanometric thickness of the nanofiller, which activates electron transport between the nanofiller and a polymer matrix, whereas the real part of the effective permittivity is controlled independently of the imaginary part through a surface extension of the graphene nanoplatelets, which affects properties of polarization of the material but not the material's electrical conductivity, and wherein an expansion temperature of graphite intercalated compound is made using a regression line $$R=-0.0002T+0.3357$$

where T is expressed in degrees centigrade and R in ohms, said regression line expressing analytically, as a function of the expansion temperature, a resistance of the graphene nanoplatelets films measured using the four-tip technique; said regression line being obtained by interpolation of experimental data.

2. The process for producing polymeric nanocomposites as per claim 1, wherein the graphene nanoplatelets are produced by thermochemical exfoliation of graphite intercalated compound, by liquid-phase exfoliation of thermally expanded graphite using as solvent acetone or dimethyl formamide, or a mixture of acetone and dimethyl formamide in amounts ranging between 5 and 15 parts out of 100 of dimethyl formamide, and between 95 and 85 parts out of 100 of acetone, and wherein a ratio of dimethyl formamide:Acetone is 1:9.

3. A process for producing a polymeric nanocomposite with electrical and electromagnetic properties controlled and predictable by applying the equivalent-effective-medium model, for electromagnetic applications, shielding and/or absorption of the energy associated to electromagnetic fields, comprising the following steps:
  a) carrying out a synthesis of graphene nanoplatelets through liquid phase exfoliation of thermally expanded graphite, modifying, through parameters of the production process, morphological and electrical properties thereof, said parameters of the production being:
  i) a temperature-to-time expansion rate higher than 2000° C./min and up to 45000° C./min;
  ii) a dispersion of expanded graphite in organic solvents or their appropriate mixture matching Hansen's solubility parameters of graphite; and
  iii) sonication with an ultrasound tip at a power in a range of 20%-100%, in pulse mode between 1 s ON-2 s OFF and 4 s ON-1 s OFF, with total ON time of 20 min, at a temperature below a boiling point of the solvent, in a range of 14° C.-20° C. in order to keep the ultrasound tip resonating throughout the dispersion of step ii);
  b) using said graphene nanoplatelets as nanofillers in a polymeric matrix selected on a basis of chemical compatibility with the graphene nanoplatelets, distributing said graphene nanoplatelets and dispersing said graphene nanoplatelets in an entire mass of the matrix in a weight percentage by a magnetic stirring technique which imparts on a magnetic anchor a motion of revolution in addition to a rotation around the magnetic anchor's own axis so as to prevent formation of graphene nanoplatelet aggregates in the mixture during complete solvent evaporation, wherein:
  i) control of the solvent evaporation rate in a range 0.05-0.2 ml/min and corresponding to a total duration between 0.5 and 24 h in order to avoid formation of graphene nanoplatelet aggregates and trapping of molecules of solvent in the nanocomposite,
  ii) utilizing a device adapted to impart on the magnetic anchor a motion of revolution in addition to the rotation around the magnetic anchor's own axis in order to avoid formation of graphene nanoplatelet aggregates and to obtain a dispersion of the nanofiller in the polymer matrix, wherein said mixing process and preventing aggregate formation, produces a nanocomposite in which an imaginary part of an effective permittivity is controlled independently of a real part through a nanometric thickness of the nanofiller, which activates electron transport between the nanofiller and a polymer matrix, whereas the real part of the effective permittivity is controlled independently of the imaginary part through a surface extension of the graphene nanoplatelets, which affects properties of polarization of the material but not the material's electrical conductivity, and wherein a rate of expansion of graphite intercalated compound is made using a regression line $$R=-4.10^{-6}r+0.1646$$

where r is expressed in degrees centigrade per minute and R in ohms; said regression line being obtained by interpolation of experimental data.

4. The process for producing polymeric nanocomposites as per claim 3, wherein the graphene nanoplatelets are produced by thermochemical exfoliation of graphite intercalated compound, by liquid-phase exfoliation of thermally expanded graphite using as solvent acetone or dimethyl formamide, or a mixture of acetone and dimethyl formamide in amounts ranging between 5 and 15 parts out of 100 of dimethyl formamide, and between 95 and 85 parts out of 100 of acetone, and wherein a ratio of dimethyl formamide:Acetone is 1:9.

* * * * *